(12) United States Patent
Wong et al.

(10) Patent No.: US 7,189,455 B2
(45) Date of Patent: Mar. 13, 2007

(54) FUSED CARBON NANOTUBE-NANOCRYSTAL HETEROSTRUCTURES AND METHODS OF MAKING THE SAME

(75) Inventors: Stanislaus S. Wong, Middle Island, NY (US); Sarbajit Banerjee, New York, NY (US)

(73) Assignee: The Research Foundation of State University of New York, Albany, NY (US)

( * ) Notice: Subject to any disclaimer, the term of this patent is extended or adjusted under 35 U.S.C. 154(b) by 134 days.

(21) Appl. No.: 10/910,784

(22) Filed: Aug. 2, 2004

(65) Prior Publication Data

US 2006/0024503 A1   Feb. 2, 2006

(51) Int. Cl.
   *B32B 9/00* (2006.01)
(52) U.S. Cl. ...................... 428/408; 977/742
(58) Field of Classification Search .......... 428/408; 423/445, 448; 977/DIG. 1, 742
   See application file for complete search history.

(56) References Cited

U.S. PATENT DOCUMENTS

| | | | | |
|---|---|---|---|---|
| 6,733,828 B2 * | 5/2004 | Chao et al. | ............ | 427/239 |
| 6,781,166 B2 * | 8/2004 | Lieber et al. | ............ | 257/211 |
| 6,875,274 B2 * | 4/2005 | Wong et al. | ............ | 117/105 |
| 6,987,302 B1 * | 1/2006 | Chen et al. | ............ | 257/368 |

OTHER PUBLICATIONS

A.P. Alivisatos, "Perspectives on the Physical Chemistry of Semiconductor Nanocrystals", *J. Phys. Chem.*, 100:13226-13239(1996).
Banarjee et al., "Functionalization of Carbon Nanotubes with a Metal-Contatining Molecular Complex", *Nano Letters*, 2(1):49-53 (Nov. 1, 2001).
Banarjee et al., "Structural Characterization, Optical Properties, and Improved Solubility of Carbon Nanotubes Functionalized with Wilkinson's Catalyst", *J. Am. Chem. Soc.*, 124(30):8940-8948(2002).
Banarjee et al., "Synthesis and Characterization of Carbon Nanotube-Nanocrystal Heterostructures", *Nano Letters*, 2(3):195-200(Jan. 12, 2002).
Dabbousi et al., "(CdSe)ZnS Core-Shell Quantum Dots: Synthesis and Characterization of a Size Series of Highly Luminescent Nanocrystallites", *J. Phys. Chem. B.*, 101:9463-9475(1997).
Kahn et al., "Solubilization of Oxidized Single-Walled Carbon Nanotubes in Organic and Aqueous Solvents through Organic Derivatization", *Nano Letters*, 2(11):1215-1218(2002).
Banerjee et al., "In Situ Quantum Dot Growth on Multiwalled Carbon Nanotubes", *J. Am. Chem. Soc.*, 125:10342-10350(Jul. 31, 2003).
Sano et al., "Noncovalent Self-Assembly of Carbon Nanotubes for Construction of 'Cages'", *Nano Lett.*, 2(5):531-533(Apr. 10, 2002).

(Continued)

*Primary Examiner*—Jennifer C. McNeil
*Assistant Examiner*—Daniel Miller
(74) *Attorney, Agent, or Firm*—Hoffmann & Baron, LLP

(57) ABSTRACT

The present invention provides a fused heterostructure comprising a carbon nanotube and at least one nanocrystal, wherein the nanocrystal is attached by a covalent linkage to at least one oxygen moiety on the nanotube, and wherein there is no intermediary linker between the nanotube and the nanocrystal.

22 Claims, 18 Drawing Sheets

OTHER PUBLICATIONS

Cassell et al., "Carbon Nanotube Networks by Chemical Vapor Deposition", *Appl. Phys. Lett.*, 82(5):817-819(Feb. 3, 2003).

Zhang et al., "Self-Networking of Carbon Nanotubes", *Chem. Commun.*, 962-963(2002).

Choi et al., "Controlled Deposition of Carbon Nanotubes on a Patterned Substrate", *Surf. Sci.*, 462:195-202(2000).

Lewenstein et al., "High-Yield Selective Placement of Carbon Nanotubes on Pre-Patterned Electrodes", *Nano Lett.*, 2(5):443-446(2002).

Wei et al., "Organized Assembly of Carbon Nanotubes", *Nature*, 416:495-496(Apr. 4, 2002).

Zhang et al., "Coaxial Nanocable: Silicon Carbide and Silicon Oxide Sheathed with Boron Nitride and Carbon", *Science*, 281:973-975(Aug. 14, 1998).

Suenaga et al., "Synthesis of Nanoparticles and Nanotubes with Well-Separated Layers of Boron Nitride and Carbon", *Science*, 278:653-655(Oct. 24, 1997).

Zhang et al., "Hetrostructures of Single-Walled Carbon Nanotubes and Carbide Nanorods", *Science*, 285:1719-1722(Sep. 10, 1999).

Hu et al., "Controlled Growth and Electrical Properties of Heterojunctions of Carbon Nanotubes and Silicon Nanowires", *Nature*, 399:48-51(May 9, 1999).

Ravindran et al., "Covalent Coupling of Quantum Dots to Multiwalled Carbon Nanotubes for Electronic Device Applications", *Nano Lett.*, 3(4):447-453(Mar. 5, 2003).

Haremza et al., "Attachment of Single CdSe Nanocrystals to Individual Single-Walled Carbon Nanotubes", *Nano Lett.*, 2(11):1253-1258(Oct. 22, 2002).

Azamian et al., "Directly Observed Covalent Coupling of Quantum Dots to Single-Walled Carbon Nanotubes", *Chem. Commun.*, 366-367(2002).

Frehill et al., "Interconnecting Carbon Nanotubes with an Inorganic Metal Complex", *J. Am. Chem. Soc.*, 124:13694-13695(Oct. 26, 2002).

Peng et al., "Formation of High-Quality CdTe, CdSe, and CdS Nanocrystals Using CdO as Precursor", *J. Am. Chem. Soc.*, 123:183-184(Dec. 9, 2000).

Peng et al., "Nearly Monodisperse and Shape-Controlled CdSe Nanocrystals via Alternative Routes: Nucleation and Growth", *J. Am. Chem. Soc.*, 124:3343-3353(2002).

Parala et al., "Confinement of CdSe Nanoparticles inside MCM-41", *Adv. Mater.*, 12(14):1050-1055(2001).

* cited by examiner

600nm 600 nm 425 nm 200 nm 200 nm 20 nm 20 nm 8 nm

Energy (in Kev)

FUSED CARBON NANOTUBE-NANOCRYSTAL HETEROSTRUCTURES AND METHODS OF MAKING THE SAME

BACKGROUND OF THE INVENTION

The present invention relates to the art of nanotechnology, and in particular, to carbon nanotube technology, its function and structure.

A carbon nanotube is a single graphene sheet in the form of a seamless cylinder. The ends of a nanotube typically have hemispherical caps. The typical diameter of a nanotube ranges from about 1 nm to 10 nm. The length of a nanotube potentially can be millions of times greater than its diameter.

Carbon nanotubes are comprised of shells of $sp^2$-hybridized carbon atoms forming a hexagonal network that is itself arranged helically within the cylinder. Basically, helicity is the arrangement of the carbon hexagonal rings with respect to a defined axis of a tube. (M. S. Dresselhaus et al "Science of Fullerenes and Carbon Nanotubes" (Academic Press, New York, 1996)).

Carbon nanotubes are grown by combining a source of carbon with a catalytic nanostructured material such as iron or cobalt at elevated temperatures. At such temperatures, the catalyst has a high solubility for carbon. The carbon links up to form graphene and wraps around the catalyst to form a cylinder. Subsequent growth occurs from the further addition of carbon.

Since their discovery in the early 1990s, carbon nanotubes have been the focus of intense study due to their very desirable and unique combination of physical properties. They are chemically inert, thermally stable, highly strong, lightweight, flexible and electrically conductive. In fact, carbon nanotubes may potentially be stiffer and stronger than any other known material.

Carbon nanotubes are currently being proposed for numerous applications, such as, for example, catalyst supports in heterogeneous catalysis, high strength engineering fibers, sensory devices and molecular wires for the next generation of electronics devices.

There has been particularly intense study of the electrical properties of nanotubes, and their potential applications in electronics. Metallic carbon nanotubes have conductivities and current densities that meet or exceed the best metals; and semiconducting carbon nanotubes have mobilities and transconductance that meet or exceed the best semiconductors.

The physical properties of carbon nanotubes are structure-dependent. For example, depending on the diameter and helicity of a nanotube, the tube can be either metallic or semi-conducting. Also, a single structural defect in a hexagonal ring can change a metallic nanotube to a semiconducting nanotube. Current methods for producing nanotubes results in a mixture of tubes with diverse diameters, helicities and structural defects. Thus, a mixture of metallic and semi-conducting nanotubes are produced.

A method of rationally modifying the physical properties of nanotubes is to chemically functionalize them with an intrinsically configurable moiety. One such moiety is the family of semiconductor nanocrystals or quantum dots, such as CdSe and CdTe, which exhibit strongly size-dependent optical and electrical properties (Murray et al., *Annu. Rev. Mater. Sci.* 30:546 (2000)). Nanocrystals are selected according to the physical properties desired to be imparted to a nanotube for a particular end use application. The products of such functionalization methods have been referred to as nanotube-nanocrystal heterostructures (Azamian et al., *Chem. Commun.* 4:366–7 (2002); Ravindran et al., *Nano Lett.* 3:447 (2003); and Haremza et al., *Nano Lett.* 2:1253 (2002)).

There are significant shortcomings of current methods by which to modify the physical properties of nanotubes. For example, there has been poor control over the surface coverage and degree of clustering of nanocrystals on nanotubes. The surface coverage and clustering directly affect the physical properties of the resulting nanotube. Thus, current methods do not allow for precise control of the physical properties of nanotubes.

In addition to modifying the physical properties of nanotubes, the ability to controllably assemble nanotubes into various designed architectures is essential to building complex, functional nanotube devices. That is, nanotubes need to be arranged into well-defined supramolecular configurations in order to design nanoscale integrated systems. Such integrated systems are required for applications such as high-efficiency computing; high-density data storage media; light harvesting in photovoltaic cells; lightweight, high-strength textiles; microelectromechanical devices; supersensitive sensors; and drug delivery agents.

Current methods of producing heterostructures are not amenable to controllably arranging nanotubes into well-defined supramolecular configurations. That is, the resulting heterostructures are primarily unorganized, discrete one-dimensional "ball-and-stick" structures. Such structures are difficult to organize into orderly assemblies which are necessary for nanoscale integrated systems.

Also, the ability to make electrical contacts between individual nanotubes within a nanotube integrated system is essential. However, current methods do not allow for reliable control over the nature of the contact between nanotubes.

Thus, the shortcomings of current methods of modifying the properties of nanotubes and of utilizing nanotubes in integrated systems present major obstacles to actualizing the utility of carbon nanotubes for end use applications.

Accordingly, there remains a need for a method of producing carbon nanotubes with particular physical properties that are necessary for various end use applications, in particular for applications pertaining to integrated systems.

SUMMARY OF THE INVENTION

The present invention provides "fused" heterostructures which comprise nanocrystals covalently linked to nanotubes without an intermediary linker, and methods for preparing same. Additionally, the invention provides nanotubes with desired physical properties, and methods for adjusting the physical properties of nanotubes. The invention also provides methods for controllably arranging nanotubes to produce nanoscale integrated systems.

In one embodiment, the heterostructure comprises a transition metal chalcogenide. Examples of the transition metal chalcogenide nanocrystal include a wurtzite cadmium selenide, a zinc blende cadmium selenide, cadmium sulfide, cadmium telluride, zinc selenide, and zinc sulfide. Further examples include is a mercury sulfide, mercury selenide, mercury telluride and zinc telluride. Further examples of a nanocrystal include gallium arsenide, indium gallium arsenide, indium phosphide and indium arsenide.

In one embodiment, the nanocrystal is a metal/semiconducting oxides. Examples of metal oxides include a titanium dioxide, zirconium oxide, aluminum oxide, iron oxide, ruthenium oxide, and silicon oxide.

In one embodiment, the nanocrystal is a colloidal elemental metal/semiconductor. Examples of colloidal elemental metals/semiconductors are gold, silver, platinum, copper, germanium and silicon.

In one embodiment, the nanocrystal is a nanobimetallic dispersion. Examples of nanobimetallic dispersions are silver/iridium, platinum/gold, silver/palladium, platinum/palladium, nickel/palladium and platinum/ruthenium.

The heterostructure comprises a single-walled nanotube, or a multi-walled nanotube. The heterostructure is a semiconductor or a metal.

In one aspect of the invention, methods of producing a fused nanotube-nanocrystal heterostructure wherein there is no intermediary linker between the nanotube and the nanocrystal is provided.

In one embodiment, the method comprises providing a nanotube mixture, wherein the nanotube mixture comprises a plurality of oxidized carbon nanotubes, a metallic entity and a ligand; and contacting the nanotube mixture with a solution comprising a chalcogen precursor or a Group V precursor at an elevated temperature, and allowing nanocrystals to form on the nanotubes, wherein a nanotube-nanocrystal heterostructure is produced.

Examples of the metallic entity include an organometallic precursor, a metal oxide, a metal sulfide, a metal sulfate, a salt of a metal or mixtures thereof. Examples of the metallic entity include zinc oxide, zinc sulfate, zinc sulfide, zinc carbonate, zinc silicate, zinc chloride, cadmium oxide, cadmium sulfide, cadmium carbonate, cadmium chloride, mercury sulfide, mercury oxide, silicon oxide and mixtures thereof.

Examples of the organometallic precursor is an alkyl cadmium, an alkyl zinc, an alkyl mercury, and mixtures thereof.

Examples of the metallic entity is gallium oxide, gallium sulfate, gallium sulfide, a gallium thiocarboxylate, indium oxide, indium sulfate, indium sulfate, trialkylammonium salts of indium, and mixtures thereof.

Further examples of the organometallic precursor is an alkyl gallium, alkyl indium, and mixtures thereof.

Examples of the ligand include a phosphine, an amine, a thiol, an alcohol, a carboxylic acid, or mixtures thereof. Further examples of the ligand includes an aliphatic or aromatic phosphine, a phosphonic acid with an alkyl chain which comprises two to twenty carbon atoms. Preferably, the phosphonic acid is tetradecylphosphonic acid (TDPA), octadecylphosphonic acid (ODPA), or hexyl phosphonic acid, or mixtures therof.

Examples of the chalcogen precursor is sulfur, selenium and tellurium. Examples of the Group V precursor is arsenic or phosphorous.

In another embodiment, the method comprises providing a nanotube mixture, wherein the nanotube mixture comprises a plurality of oxidized carbon nanotubes, an organometallic precursor and a ligand; and oxidizing or hydrolyzing the nanotube mixture at an elevated temperature, and allowing nanocrystals to form on the nanotubes, wherein a nanotube-nanocrystal heterostructure is produced.

Examples of the organometallic precursor includes a titanium, zirconium, aluminum, iron or ruthenium compound.

Examples of the ligand includes a phosphine, a phosphonic acid, an amine, a thiol, an alcohol, a carboxylic acid, or mixtures thereof. Further examples of the ligand includes tetradecylphosphonic acid (TDPA) or octadecylphosphonic acid (ODPA).

In another embodiment, the method comprises providing a nanotube mixture, wherein the nanotube mixture comprises a plurality of oxidized carbon nanotubes, a metallic/semi-conducting entity and a ligand; and heating the nanotube mixture, and allowing nanocrystals to form on the nanotubes, wherein a nanotube-nanocrystal heterostructure is produced.

Examples of the metallic/semi-conducting entity include a colloidal elemental metal, a nanobimetallic dispersion, and organic derivatives of germanium or silicon. Further examples include a colloidal elemental gold, silver, platinum or copper; a nanobimetallic dispersion of silver/iridium, platinum/gold, silver/palladium, platinum/palladium, nickel/palladium or platinum/ruthenium; or an organic derivatives of germanium or silicon.

In another aspect, the present invention provides a method of forming a nanocrystal. In one embodiment, the method comprises providing a nanotube mixture, wherein the nanotube mixture comprises a plurality of oxidized carbon nanotubes, a metallic entity and a ligand, wherein the metallic entity is an organometallic precursor, a metal oxide, a metal sulfide, a metal sulfate, a salt of a metal or mixtures thereof; and contacting the nanotube mixture with a solution comprising a chalcogen precursor or a Group V precursor at an elevated temperature, allowing a nanocrystal to form on a nanotube, and allowing the nanocrystal to detach from the nanotube, wherein a nanocrystal is produced.

In another embodiment, the method comprises providing a nanotube mixture, wherein the nanotube mixture comprises a plurality of oxidized carbon nanotubes, an organometallic precursor and a ligand; and oxidizing or hydrolyzing the nanotube mixture at an elevated temperature, and allowing a nanocrystal to form on the nanotubes, and allowing the nanocrystal to detach from the nanotube, wherein a nanocrystal network is produced.

In another embodiment, the method comprises providing a nanotube mixture, wherein the nanotube mixture comprises a plurality of oxidized carbon nanotubes, a metallic/semi-conducting entity and a ligand; and heating the nanotube mixture, and allowing a nanocrystal to form on the nanotubes, and allowing the nanocrystal to detach from the nanotube, wherein a nanocrystal network is produced.

In another aspect, the present invention provides a nanoscale assembly comprising at least two heterostructures wherein a heterostructure comprises a carbon nanotube and at least one nanocrystal, wherein the nanocrystal is attached by a covalent linkage to at least one oxygen moiety on the nanotube, wherein there is no intermediary linker between the nanotube and the nanocrystal, and wherein the heterostructures of the assembly are joined by nanocrystals.

The fused nanotube-nanocrystal heterostructures of the present invention provide several advantages over current nanotube technology.

For example, unlike current production methods in which the physical properties of the resultant nanotubes can only be controlled to a limited extent, the methods of the present invention allow for a more much precise placement of nanocrystals on nanotubes, thereby allowing for greater control of the physical properties of nanotubes. Additionally, vastly more nanocrystals can be placed on a nanotube than by previous methods, thus allowing for greater enhancement of the physical properties of nanotubes. Moreover, without a linker between the nanocrystal and the nanotube, the nanocrystals can more effectively influence the properties of the nanotubes in these "fused" heterostructures. Accordingly, the "fused" heterostructures are accorded physical properties that are more precisely tailored to meet the needs of various end use applications.

Moreover, current methods of making heterostructures involve complicated multi-step processes. In contrast, the methods of the present inventions allow for single step-production processes.

Furthermore, unlike current methods of producing heterostructures which do not allow for supramolecular positioning of nanotubes, the "fused" heterostructures can be grown as orderly assemblies. In particular, previous methods for assembling heterostructures into supramolecular systems required manipulation of single heterostructures. Whereas, the methods of the present invention allow for the heterostructures to be assembled in situ. That is, the heterostructures assemble into supramolecular systems while the heterostructures are being formed. Such assemblies are essential for producing nanoscale integrated systems.

Also, the ability to make electrical contacts between individual nanotubes within a nanotube integrated system is essential. Unlike current methods which do not allow for reliable control over the nature of the contacts between nanotubes, the heterojunction between the nanotubes and nanocrystals in these "fused" heterostructures can be controlled. Control of the nature of the heterojunction allows for manipulation of the electronic and optical properties of nanoscale devices which contain the "fused" heterostructures. Particularly important for electronic devices, the present invention allows for seamless junction between nanotubes.

For a better understanding of the present invention, reference is made to the following description, taken in conjunction with the accompanying drawings, and the scope of the invention set forth in the claims.

DETAILED DESCRIPTION OF THE INVENTION

Figure 1A:
FIG. 1. (a) High-resolution TEM image of pristine, unprocessed multiwalled nanotubes. Scale bar represents 20 nm. (b) Low-resolution. TEM image of a processed, "clean" tube. Scale bar represents 125 nm. (c) Open tip of an oxidized MWNT. (d) Serrated edges where the outer wall has been substantially etched away. Scale bars represent 7 and 8 nm, respectively, for these high-resolution images. Arrows point to areas on the MWNT where the outer wall has been etched away, leaving behind dangling oxygenated, functional groups.

A fused heterostructure of the present invention comprises a carbon nanotube covalently linked, such as coordinatively linked, to at least one nanocrystal without an intermediary linker.

The carbon nanotubes of the heterostructures comprise graphene in cylindrical form. The nanotubes preferably have open ends. Alternatively, the nanotubes can have one or two hemispherical caps on their ends. In addition to the hexagonal carbon rings of graphene, the caps can comprise pentagonal rings of carbon. The carbon nanotube can be a semi-conducting nanotube or a metallic nanotube. (A metallic nanotube has no band gap.)

The carbon nanotube can be either single-walled nanotubes (SWNTs) or multi-walled nanotubes (MWNTs). A SWNT comprises only one nanotube. A MWNT comprises more than one nanotube each having a different diameter. Thus, the smallest diameter tube is encapsulated by a larger diameter tube, which in turn, is encapsulated by another larger diameter nanotube. A MWNT comprises, for example, up to about fifty nanotubes shells.

SWNTs typically have a diameter of about 0.7 to about 2.5 nm, and a length of up to about one mm. MWNTs typically have a diameter of about 3 to about 30 nm, and a length of up to about one mm.

SWNTs and MWNTs are produced, typically, as bundles. A bundle comprises a plurality of SWNTs or MWNTs. The diameter of a bundle of SWNTs is typically about 10 to 20 nm. The diameter of a bundle of MWNTs is typically about 2.5 to 250 nm.

The carbon nanotubes can be prepared by methods known in the art. For example, carbon nanotubes can be prepared by the laser vaporization. (Thess et al. Science 273: 483 (1996)). Also, carbon nanotubes can be prepared by arc discharge (Ishigami, M. et al. Chem. Phys. Lett. 319:457 (2000); Su, M. et al. Chem. Phys. Lett. 322:321 (2000); Journet, C. et al. Nature 388:756 (1997); Colbert et al. Science 266:1218, (1994)); Shi, Z. et al. Carbon 37:1449 (1999) and Ebbeson, T. et al. Nature 358:220 (1992)). The carbon nanotubes can be prepared by catalytic chemical vapor deposition (Kukovitsky, E. F. et al. Chem. Phys. Lett. 317:65 (2000); Su, M. et al. Chem. Phys. Lett. 322:321 (2000); Li et al. Science 274:1701 (1996); and Pan, Z. et al. Chem. Phys. Lett. 299:97 (1999)).

The carbon nanotubes may optionally be doped with other elements, for example, with metals, such as boron or nitrogen; or gases, such as ammonia and oxygen, by methods known in the art.

The nanocrystal of the heterostructure is any moiety or structure whose intrinsic properties, such as optical and electrical properties, are configurable. Most typically, the intrinsic properties are configurable by varying the particle size of the nanocrystal.

In one embodiment, the nanocrystal is a member of the family of semiconductor nanocrystals, also known as quantum dots. Examples of such quantum dots include the transition metal chalcogenides. Examples of transition metal chalcogenide nanocrystal include zinc sulfide, zinc selenide, zinc telluride, cadmium sulfide, wurzite cadmium selenide, zinc blende cadmium selenide, cadmium telluride, mercury sulfide, mercury selenide and mercury telluride. Further examples of quantum dots include gallium arsenide, indium gallium arsenide, indium phosphide, and indium arsenide. Preferably, the quantum dots of the heterostructures are wurtzite cadmium selenide, cadmium sulfide, cadmium telluride, zinc selenide, and zinc sulfide.

Quantum dots exhibit strongly size-dependent optical and electrical properties. In particular, the band gap of these quantum dots decreases with increasing particle size. (Alivisatos, A. P. J. Phys. Chem. 100:13226–39 (1996).) For example, by varying the particle size of CdS, the band gap can be tuned between 2.5 and 4 eV.

The emission and absorption wavelengths of carbon nanotubes can be adjusted, or tuned, by varying the size of the quantum dots which are linked to the nanotubes. Thus, heterostructures which comprise quantum dots are, for example, useful for constructing optoelectronic devices with tailored properties.

In another embodiment, the nanocrystals of the heterostructures are members of the family of metal oxide nanocrystals. These nanocrystals exhibit size-dependent magnetic behavior. Examples of suitable metal oxide nanocrystals include titanium dioxide, iron oxide, zirconium oxide, aluminum oxide, ruthenium oxide and silicon oxide.

In another embodiment, the nanocrystal of the heterostructure is a colloidal elemental metal/semiconductor nanocrystal. Examples of colloidal elemental metal nanocrystals for use in the heterostructures are gold, silver, platinum, copper, palladium, nickel, iron, rhodium, iridium, germanium and silicon. Gold, silver, platinum and copper are preferred. These nanocrystals exhibit size-dependent electronic, optic and catalytic behavior.

In another embodiment, the nanocrystal of the heterostructure is a nanobimetallic dispersion. Examples of such dispersions include silver/iridium, platinum/gold, silver/palladium, platinum/palladium, nickel/palladium and platinum/ruthenium. These nanocrystals exhibit size-dependent electronic, optic, catalytic and magnetic behavior.

In one embodiment, a variety of different nanocrystals, or a variety of different nanocrystal families, can be present on a nanotube. For example, both CdSe and CdTe nanocrystals can be on one nanotube. Alternatively, for example, CdSe and CdTe nanocrystals along with ZnS nanocrystals, preferably on the ends, can be on one nanotube.

Nanocrystals in accordance with the present invention can have any suitable average cross-section. Examples of a minimum cross-section include about 1 Å, about 5 Å, about 10 Å, and about 50 Å. Examples of a maximum cross-section include about 60 Å, about 100 Å, about 250 Å, and about 500 Å. A suitable range includes any number from the minimum and any number from the maximum. For example, the average particle size of a wurtzite CdSe quantum dot can be about 42±3 Å. As another example, the average particle size of a titanium dioxide particle can be about 45±5 Å.

The nanocrystal is attached to at least one oxygen moiety, i.e. oxygen functional group, on the nanotube by a covalent linkage. Oxygen moieties include carboxyl, hydroxyl, aldehydic, ketonic, esteric and etheric functional groups. The attachment between the nanocrystal and the oxygen moiety on the nanotube is a direct attachment. That is, there is no intermediary linker between the nanocrystal and the nanotube. (Examples of intermediary linkers include amide linkers, thiol linkers, and organic linkers.) For the purposes on this specification, a "fused" heterostructure comprises at least one of these direct attachments.

A covalent linkage is the sharing of electrons by a pair of atoms. The covalent linkage can be via a single bond, i.e. one pair of electrons shared; or a double bond, i.e. two pairs of electrons shared. Preferably, the covalent linkage is a coordinative linkage. A coordinative linkage comprise a pair of electrons donated by only one of the two atoms that are joined. The covalent linkages can also be polar covalent bonds (hybrid bonds). Such bonds are partially ionic in nature; that is, the electrons are not shared equally.

Any suitable percentage of carbon atoms on a fused heterostructure of the present invention can have a nanocrystal attached. Examples of a minimum percentage include about 1%, about 5%, and about 10%. Examples of a maximum percentage include about 15%, about 20%, and about 35%. A suitable range includes any number from the minimum and any number from the maximum.

Methods of Making "Fused" Heterostructures

In another aspect, the present invention provides methods of making the "fused" heterostructures described above. These methods involve in situ growth of nanocrystals on nanotubes. These methods comprise utilizing oxygen moieties on the surfaces of carbon nanotubes as nucleation sites for the growth of nanocrystals.

The production of the "fused" heterostructures of the present invention are based on the presence of at least one oxygen moiety on a nanotube by which to allow the covalent linkage with a nanocrystal. The nanotubes from which the heterostructures are produced can be single-walled nanotubes or multi-walled nanotubes.

The oxygen moieties can be located anywhere on the outer surfaces of the nanotubes. For example, the moieties can be at the tips of open-ended nanotubes, or on the sidewalls of nanotubes. The density of oxygen moieties on a nanotube, and the positions of the moieties on a nanotube, can be controlled by the manner selected to oxidize the nanotubes. Different methods of obtaining nanotubes with oxygen moieties follow.

In one embodiment, a minimum amount of oxygen moieties are placed on nanotubes. In this embodiment, the nanotubes are not oxidized. Some oxygen moieties arise on carbon nanotubes during their formation.

In another embodiment, carbon nanotubes with oxygen moieties are produced by oxidation processes. Processes for oxidizing nanotubes are well known in the art.

In one embodiment, a moderate level of oxygen moieties are placed on the nanotubes. An example of a moderate level includes about 5% to about 10% of the carbon atoms on a nanotube have attached oxygen moieties. Examples of methods of oxidation to produce nanotubes with a moderate level of oxygen moieties follow. Raw SWNT bundles can be oxidized according to existing procedures involving acidic potassium permanganate solution and hydrochloric acid. See for example Hiura et al. *Adv. Mater* 7:275 (1995). Also, for example, MWNT samples prepared via arc discharge can be purified by oxidizing the carbon nanotubes at 700° C. in the presence of air until approximately 2% of the original mass remained. SWNT samples can be prepared via arc discharge, pulsed laser vaporization, or chemical vapor deposition. The SWNT samples can be purified by sonication and filtration through 0.8 micron pore membranes. See for example, Bonard et al. Adv. Mat., 9, 827 (1997), K. Tohji et al. J. Phys. Chem. B, 101, 1974 (1997), and K. Tohji et al., Nature, 383, 679, (1996). In these methods of oxidation, oxygen moieties are preferentially placed on the end caps of the nanotubes, and on defect sites of the nanotubes. Other examples of moderate oxidation methods include wet air-oxidization; gaseous phase oxidation; acid phase oxidation, e.g., nitric acid oxidation; and other types of liquid phase oxidation.

In another embodiment, oxygen moieties can preferentially placed on the sidewalls of nanotubes. For example, U.S. application Ser. No. 10/701,402 describes methods for preferentially placing oxygen moieties on the sidewalls of nanotubes. The application is incorporated herein by reference in its entirety. The application also includes methods of controlling the type of oxygen moieties placed on carbon nanotubes. The method comprises contacting ozonized carbon nanotubes with a particular type of cleaving agent. For providing carbon nanotubes comprising predominately carboxylic and/or esteric moieties, peroxides are used as the cleaving agent. For providing carbon nanotubes comprising predominately ketonic and/or aldehydic moieties, reducing agents are used as the cleaving agent. For providing carbon nanotubes comprising predominately alcoholic and/or ether moieties, sodium borohydride solution or lithium aluminum hydride are used as the cleaving agent. This oxidizing method allows for different densities of oxygen moieties to be placed on the nanotubes. The density can range from about 1 to about 35% of the carbon atoms on the nanotubes have an oxygen moiety. A high level of oxygen moieties is about 25 to 35% of the carbon atoms on the nanotubes have an oxygen moiety.

The carbon nanotubes with oxygen moieties used in the present methods can be produced or obtained from an outside source.

Optionally, the carbon nanotubes can be shortened. Techniques by which to shorten nanotubes include acid etching, ion beam milling, ball milling, and gas etching, as would be known by a skilled artisan.

Methods of Making Heterostructures Comprising Quantum Dot Nanocrystals

Preferred methods of producing heterostructures comprising quantum dot nanocrystals follow. Nanotubes, which comprise oxygen moieties (i.e. a plurality of oxidized carbon nanotubes), are placed in an organic solvent to form a carbon nanotube dispersion. Examples of organic solvents include dimethylsulfoxide (DMSO), tetrahydrofuran (THF), dimethylformamide (DMF), methanol, ethanol, 2-propanol, acetone, o-dichlorobenzene (ODCB), ethyl acetate, benzene, hexanes, octadecene, and trioctyl phosphine. Preferably, the organic solvent is, for example, DMSO, THF, or DMF. The dispersion can optionally be sonicated.

To this nanotube dispersion is added a metallic entity and a ligand to form a nanotube mixture. Preferably, the addition of the metallic entity and the ligand to the carbon nanotube mixture takes place in an inert atmosphere at an elevated temperature. The temperature can range from about 120° C. to about 400° C., preferably from about 300° C. to about 35020 C. During the addition, the mixture is preferably stirred vigorously. The quantity of the ligand and the oxygen moieties on a nanotube is about two or three times as much as the metallic entity by weight. In one embodiment, the ratio of the ligand to the nanotube is about 1000 to 1 by weight. Preferably, a substoichiometric amount of the ligand is used to enhance the coordination of the metallic entities to the oxygen moieties on the nanotubes.

The metallic entity used in these methods is an organometallic precursor, a metal oxide, a metal sulfide, a metal sulfate, or a salt of a metal. Mixtures of these metallic entities can also be used.

Preferred examples of organometallic precursors include alkyl transition metals, such as an alkyl cadmium, an alkyl zinc, and an alkyl mercury; or an alkyl gallium and an alkyl indium. Preferably, the alkyl groups on these organometallic precursors comprise approximately two to twenty carbon atoms. Preferred examples of these organometallic precursors include dimethyl cadmium, dimethyl zinc, dimethyl mercury, dimethyl gallium and dimethyl indium.

Preferred examples of metal oxides include transition metal oxides, such as zinc oxide, mercury oxide and cadmium oxide; or gallium oxide and indium oxide. Preferred examples of metal sulfides and sulfates include transition metal sulfates and sulfides, such as zinc sulfate, zinc sulfide, cadmium sulfide, cadmium sulfate, mercury sulfide and mercury sulfate; or gallium sulfate, gallium sulfide, indium sulfate and indium sulfate.

Preferred examples of salts of metals include cadmium carbonate, cadmium chloride, zinc carbonate, zinc silicate and zinc chloride; or a gallium thiocarboxylate and trialkylammonium salts of indium.

A ligand, for the purposes of this invention, is an entity that is capable of donating or accepting a pair of electrons to form a coordinate covalent bond with a second entity. Preferred examples of ligands include phosphines, amines (e.g. alkyl amines comprising about two to twenty carbon atoms, i.e. octadecyl amine), thiols (e.g. undecanethiol), alcohols (e.g. alkyl alcohols comprising about two to twenty carbon atoms, i.e. poly ethylene glycol), carboxylic acids (e.g. an aliphatic carboxylic acid comprising four to twenty carbon atoms, stearic acids, oleic acids, and 11-aminoundecanoic acid). Mixtures of these ligands can be used.

Preferred examples of phosphines include aliphatic or aromatic phosphines wherein the phosphine comprises approximately four to twenty carbon atoms; and phosphonic acids with alkyl chains which comprise approximately two to twenty carbon atoms. Mixtures of these phosphines can be used. Preferred examples of phosphonic acids include tetradecylphosphonic acid (TDPA); octadecylphosphonic acid (ODPA) and hexyl phosphonic acid.

Nanotube mixtures which comprise a transition metal are contacted with an organic solution which comprises chalcogen precursors. The contact takes place at elevated temperatures. Preferably, the temperature can range from about 120 to about 400° C., more preferably from about 300 to about 350° C. Preferred examples of chalcogen precursors are sulfur, selenium and tellurium in solution. Mixtures of these precursors can be used. Examples of chalcogen precursors include trioctyl phosphine selenium (TOPSe) and tellurium in toluene.

Nanotube mixtures which comprise gallium or indium are contacted with an organic solution which comprises Group V precursor at elevated temperatures. The contact takes place at elevated temperatures. Preferably, the temperature can range from about 120 to about 400° C., more preferably from about 300 to about 350° C. Preferred examples of Group V precursors include arsenic and phosphorous. Mixtures of these precursors can be used. An example of a Group V precursor includes triphenyl phosphine.

Any suitable solvent can be used with the organic solutions which comprise the chalcogen precursors or the Group V precursors. Preferred examples of the solvent include, but are not limited to, alkyl phosphines comprising about two to twenty carbon atoms, dimethylsulfoxide (DMSO), tetrahydrofuran (THF), dimethylformamide (DMF), methanol, ethanol, 2-propanol, acetone, o-dichlorobenzene (ODCB), ethyl acetate, benzene, and hydrocarbon solvents (e.g., octadecene, cyclohexane, hexane and heptane). Preferred examples of the phosphines include trialkylphosphine, such as, for example, trioctylphosphine (TOP), tributylphosphine. Mixtures of different phosphines can also be used.

After contacting the nanotube mixtures with the organic solutions, the temperature is lowered by about 30° C. to about 70° C., and solid state nanocrystals are allowed to form on the nanotubes, producing the "fused" heterostructures. Preferably, after about fifteen minutes to an hour or more, the heating source is removed. Separation of heterostructures from free nanocrystals by, for example, dissolution and filtration, can follow.

Methods of Making Heterostructures Comprising Metal Oxide Nanocrystals

Preferred methods of producing heterostructures comprising metal oxide nanocrystals follow. The nanotube dispersion is prepared as described for the production of heterostructures which comprise quantum dot nanocrystals.

To this nanotube dispersion is added an organometallic precursor and a ligand to form a nanotube mixture. Preferably, the addition of the organometallic precursor and the ligand to the carbon nanotube mixture takes place in an inert atmosphere at an elevated temperature. The temperature can range from about 120° C. to about 400° C., preferably from about 300° C. to about 350° C. During the addition, the mixture is preferably stirred vigorously. The quantity of the ligand and the oxygen moieties on a nanotube is about two or three times as much as the metallic entity by weight. In one embodiment, the ratio of the ligand to the nanotube is about 1000 to 1 by weight. Preferably, a substoichiometric amount of the ligand is used to enhance the coordination of the organometallic precursor to the oxygen moieties on the nanotubes.

Preferred examples of organometallic precursors used in these methods include organic compounds of titanium, zirconium, aluminum, iron, ruthenium or silicon compounds.

Mixtures of these compounds can also be used. Examples of these compounds include isopropoxides and acetates of these organometallic precursors.

The ligands used in these methods are the same as those described for the heterostructures that comprises the quantum dots.

The nanotube mixture is then oxidized or hydrolyzed at elevated temperatures. The temperature can range from about 100° C. to about 400° C., preferably from about 280° C. to about 350° C. Preferred methods of oxidation include contacting the nanotube mixture with an oxidizing agent, as would be known by a skilled artisan. Preferred examples of oxidizing agents are oxygen, ozone, nitrous oxide, pyridine oxide, hydrogen peroxide and acids. Preferred methods of hydrolysis include contacting the nanotube mixture with an oxidizing agent and water, as would be known by a skilled artisan.

After oxidization or hydrolysis of the nanotube mixtures, the temperature is lowered by about 30° C. to about 70° C., and solid state nanocrystals are allowed to form on the nanotubes, producing the "fused" heterostructures. Preferably, after about fifteen minutes to an hour or more, the heating source is removed.

Methods of Making Heterostructures Comprising Elemental Nanocrystals

Preferred methods of producing heterostructures comprising elemental nanocrystals follow. The nanotube dispersion is prepared as described for the production of heterostructures which comprise quantum dot nanocrystals.

To this nanotube dispersion is added a metallic or semiconducting entity and a ligand to form a nanotube mixture. Preferably, the addition of the entity and the ligand to the carbon nanotube mixture takes place in an inert atmosphere at an elevated temperature. The temperature can range from about 120° C. to about 400° C., preferably from about 300° C. to about 350° C. During the addition, the mixture is preferably stirred vigorously. The quantity of the ligand and the oxygen moieties on a nanotube is about two or three times as much as the metallic entity by weight. In one embodiment, the ratio of the ligand to the nanotube is about 1000 to 1 by weight. Preferably, a substoichiometric amount of the ligand is used to enhance the coordination of the entity to the oxygen moieties on the nanotubes.

Preferred examples of metallic entities include colloidal elemental metals, and nanobimetallic dispersions. Examples of colloidal elemental metals include gold, silver, platinum and copper. Examples of nanobimetallic dispersions include silver/iridium, platinum/gold, silver/palladium, platinum/palladium, nickel/palladium and platinum/ruthenium. Other examples of a metallic entity include organic derivatives of germanium, i.e. andgermylenes. An example of a semiconducting entity is an organic derivation of silicon. Examples of these derivatives include silanes and silylenes.

Optionally, the nanotube mixture can be reduced with reducing agents, such as, for example, sodium borohydride, potassium borohydride, lithium borohydride, tetraethylammonium borohydride, tetrabutylammonium borohydride, sodium triacetoxyborohydride, lithium aluminum hydrate, and other reducing agents.

The ligands used in these methods are the same as those described for the heterostructures that comprises the quantum dots.

The nanotube mixture is then heated to elevated temperatures. The temperature can range from about 100° C. to about 400° C., preferably from about 280° C. to about 350° C. After approximately five minutes to approximately two hours, the temperature is lowered by about 30° C. to about 70° C., and solid state nanocrystals are allowed to form on the nanotubes, thereby producing the heterostructures. Preferably, after about fifteen minutes to an hour or more, the heating source is removed.

Methods of Making Heterostructures with Nanocrystals of a Variety of Different Nanocrystal Families In one embodiment, a variety of different nanocrystals, or a variety of different nanocrystal families, can be placed on a nanotube. For example, both CdSe and CdTe nanocrystals can be on one nanotube. Alternatively, for example, CdSe and CdTe nanocrystals along with ZnS nanocrystals, preferably on the ends, can be on one nanotube. In the embodiment in which a variety of different families are placed on a nanotube, preferably nanocrystals of one family are grown first, and then nanocrystals from another family are grown separately.

Methods of Making Nanocrystals

In another aspect of the present invention, methods of forming nanocrystals are provided. These methods allow for control of the size and the shape of the nanocrystals.

In one embodiment, the methods of forming nanocrystals comprise the methods of making heterostructures which comprise quantum dot nanocrystals, as described above. In another embodiment, the methods of forming nanocrystals comprise the methods of making heterostructures which comprise metal oxide nanocrystals, as described above. In another embodiment, the methods of forming nanocrystals comprise the methods of making heterostructures which comprise elemental metal/semi-conducting nanocrystals, as described above.

During the formation of heterostructures, at least one nanocrystal nucleates on a nanotube. Nanocrystals grow, and then detach from nanotubes and fall into the nanotube mixtures. Nanocrystals detach from nanotubes at various stages of their growth process. Accordingly, nanocrystals which are formed in this way have a broad range of sizes. (In contrast, nanocrystals grown in solution are a relatively uniform in size.) Nanocrystals can be precipitated out of the nanotube mixture by methods known in the art.

The size and shape of nanocrystals is controllably skewed by the methods of the invention. Nanotubes act as spatially constraining templates thereby directing the placement of nanocrystals. The characteristics of nanotubes can be varied which in turn affect the growth of nanocrystals.

The size of nanocrystals can be controlled by several techniques. For example, nanocrystal formation is constrained by the steric bulk of neighboring nanotubes. As the lengths of nanotubes increase, the shorter the distances between nanotubes become and the more constrained the growth of nanocrystals becomes. The lengths of nanotubes can be controlled. For example, nanotubes can be shortened by techniques known in the art, such as, for example, acid and gas etching; and ion beam and ball milling. For example, the nanotubes can be shortened to lengths of about 100 to about 300 nm.

Another characteristic of nanotubes which can be varied is the density of oxygen moieties on the tube. The density of oxygen moieties can be controlled by the degree of oxidation of tubes, as described above. As the density of oxygen moieties on nanotubes increases, the number of nanocrystals that nucleate on nanotube surfaces increases. As the number of nanocrystals that nucleate on the nanotubes increases, the growth of nanocrystals is constrained thereby decreasing the size distribution of the nanocrystals.

Since nanocrystals nucleate more easily at carboxyl oxygen moieties than at other oxygen moieties, preferably carboxyl functional groups are placed on nanotubes.

An additional characteristic of nanotubes which can be modulated is the position of the oxygen moieties on the nanotubes. The oxygen moieties can be positioned on the ends of the tubes or on the side walls, as described above.

A further characteristic of nanotubes which can be modulated is the degree of bundling of nanotubes, i.e. the aggregation of the nanotubes. The degree of bundling can be controlled by various physicochemical means including oxidation and sonication, as is known in the art. As the degree of bundling increases, the growth of each nanocrystal is constrained thereby decreasing its size.

There is a large variation of the shapes of the nanocrystals formed by this method vis-à-vis nanocrystals grown in solution, i.e. from spherical shapes to rod-like shapes. For example, the average aspect ratio of the resultant nanocrystals ranges from about 1 to about 20. The aspect ratio is the ratio of the length of the nanocrystal to its width. Also, the length of the long axis of the nanocrystals ranges from about 0.5 nm to about 20 nm. Variation results from the spatial environment in which a particular nanocrystal was grown.

That is, the shape of nanocrystals is controlled by the spatial location and distribution of oxygen moieties on the nanotube surfaces, as well as the proximity of nanotubes to one another. Nanocrystal formation is constrained by the steric bulk of neighboring nanotubes and nanocrystals as described above. Steric bulk induces preferential monomer addition to one face of the growing crystallite by limiting spatial access of another face to monomer flux. Such growth leads to anisotropic nanocrystal formation.

By increasing the steric bulk by the methods described, a significant portion of the nanocrystals have an elongated shape, i.e. rod-like shape. For example, as the density of oxygen moieties placed on the sidewalls of nanotubes increases, the average aspect ratio of the resultant nanocrystals increase. In particular, the average aspect ratio of the resultant nanocrystals is about 10 to about 20. Also, the length of the long axis of the resultant nanocrystals is about 10 nm to about 20 nm.

Another factor that favors rod-like nanocrystal shapes is a preferential attachment to a particular facet of a growing crystal due to the instrinsic structure of the nanocrystal. For example, in intrinsically anisotropic nanocrystals, such as, for example, wurtzite nanocrystals, one facet of the nanocrystal is favored over another resulting in rod-like shapes.

The present invention provides another manner in which to form nanocrystals. While forming the heterostructures, as described above, nanocrystals become coated with ligands and nucleate in the nanotube mixtures (i.e. without linking to a nanotube) and grow. For example, phosphonic acid-coated CdTe nanocrystals (quasi-spherical, 5 nm), nucleate and grow freely in the trioctylphosphine oxide (TOPO) solution. These nanocrystals are extracted during a purification step by repeated toluene washing. Unlike the nanocrystals which were attached to the heterostructure for a period of time, these nanocrystals are relatively monodisperse in size.

Both types of nanocrystals (i.e. those nanocrystals which nucleated to heterostructures, and those nanocrystals which nucleated in solution) are preferably produced simultaneously.

Methods of Controllably Assembling Nanocomponents

In another aspect of the present invention, methods of controllably assembling nanocomponents into nanotube-based composites, i.e. supramolecular nanostructures, are provided. (Nanocomponents comprise nanotubes and nanocrystals.) In particular, carbon nanotubes act as templates for the guided in situ growth of nanocrystals which in turn act as templates for the placement of additional nanotubes, which act as templates for the growth of additional heterostructures, and so on. That is, prior-placed heterostructures, nanotubes and/or nanocrystals control the placement of the additional heterostructures, nanotubes and/or nanocrystals.

The nanotube-based composites of the present invention can comprise two nanotubes (e.g. a probe) to hundreds of thousands of nanotubes. The nanotube composites can have a two dimensional or three dimensional architecture.

In one embodiment, the methods of assembling nanocomponents comprise the methods of making heterostructures which comprise quantum dot nanocrystals, as described above. In another embodiment, the methods of assembling nanocomponents comprise the methods of making heterostructures which comprise metal oxide nanocrystals, as described above. In another embodiment, the methods of assembling nanocomponents comprise the methods of making heterostructures which comprise elemental metal/semi-conducting nanocrystals, as described above.

As described above, the structure and properties of nanotubes can be modulated. For example, nanotubes can be semi-conducting or electronic; the length of nanotubes can be varied; and the density, position and types of oxygen moieties on nanotubes can be varied. Also, as described above, the structure and properties of nanocrystals can be modulated. For example, different types of nanocrystals have different properties, e.g. electronic, optical and/or magnetic properties. For instance, nanocrystals can be semi-conducting or electronic. The properties of nanocrystals can further be modulated by the size of the nanocrystals. The different types of nanotubes and nanocrystal are selected and used as building blocks for nanotube-based composites.

Also, as described above in the methods for making nanocrystals, various factors in making the "fused" heterostructures of the present invention can be modulated. For example, characteristics of heterostructures that can be controlled include the position and density of nanocrystals on nanotubes; and the size and shape of nanocrystals on nanotubes. Furthermore, as described above, the degree of bundling of nanotubes can be modulated.

By modulating the nanotubes, nanocrystals and heterostructures, as described above, nanotube-based composites are formed which are tailored to particular end use applications as would be known to a skilled artisan.

Additionally, the heterojunction (i.e. the connection between a nanotube and a nanocrystal) is controlled. In one embodiment, a nanotube-based composite comprises a heterojunction between a metallic nanotube and a semi-conducting nanocrystal. In another embodiment, a nanotube-based composite comprises a heterojunction between a metallic nanotube and metallic nanocrystal. In another embodiment, a nanotube-based composite comprises a heterojunction between a semi-conducting nanotube and a metallic nanocrystal. In another embodiment, a nanotube-based composite comprises a heterojunction between a semi-conducting nanotube and semi-conducting nanocrystal.

The in situ methods of assembling nanocomponents allows for the crystals on one nanotube to grow to meet the crystals on another nanotube, i.e. for the growth of nanocrystals between the nanotubes. Such growth provides a seamless connection between tubes. This connection allows for efficient communication between the tubes (e.g. electrical, optical and magnetic communication). Additionally, since the size, shape and chemistry of nanotubes and nanocrystals can be controlled by the methods of this invention, the connection between the nanotubes can be controlled, i.e. tuned, to be tailored for a particular application.

The seamless connection between nanotubes allows for efficient carrier mobility in nanomaterials, such as for electronic structure, carrier trapping, and delocalization, and for the optimization of photovoltaic devices. Additionally, the seamless connection allows for better charge separation and more efficient light harvesting.

The resulting nanotube-based composites can be used in high-efficiency computing, high-density data storage media, light harvesting in photovoltaic cells, lightweight, high-strength textiles, supersensitive sensors, drug delivery agents, and high-density electronic junction devices.

In another aspect of the invention, a device comprising a "fused" heterostructure of the present invention is provided. The device is, for example, a sensor, a device used in molecular electronics, a solar cells, a device used in optoelectronics, a device used in nanocatalysis, and a scanning probe microscopy tip.

Methods of Modifying the Physical Properties of Nanotubes

In another aspect of the invention, a method of modifying a physical property of a nanotube is provided. The method comprises covalently linking at least one nanocrystal to a carbon nanotube.

The physical property which is modified is, for example, electronic properties, electrical properties, electromechanical properties, optical properties, chemical properties, mechanical properties, structural properties and thermoelectric properties.

The electrical property which is modified can be, for example, conductance, resistivity, carrier mobility, transport properties, permittivity, and charge transfer properties. The modification of conductance can be, for example, a tunability in conductance. For example, with particular nanocrystals, as the particle size of a nanocrystal is increased, the conductance of the nanotube is increased.

The structural property which is modified can be, for example, elasticity, mechanical properties, and ease of composite formation.

In one embodiment, the methods of modifying a physical property of a nanotube comprise the methods of making heterostructures which comprise quantum dot nanocrystals, as described above. In another embodiment, the methods of modifying a physical property of a nanotube comprise the methods of making heterostructures which comprise metal oxide nanocrystals, as described above. In another embodiment, the methods of modifying a physical property of a nanotube comprise the methods of making heterostructures which comprise elemental metal/semi-conducting nanocrystals, as described above.

Method of Localizing/Quantifying Defect Sites on a Carbon Nanotube

In another aspect of the invention, a method of localizing defect sites on a carbon nanotube is provided. The method comprising adding nanocrystals to a carbon nanotube. The nanocrystals form covalent linkages with the defect sites. The location of the sites are detected. The detection is accomplished with microscopy or micro-spectroscopy. Examples of microscopy include transmission electron, scanning electron and atomic force microscopy.

In another aspect of the invention, a method of quantifying defect sites on a carbon nanotube is provided. The method comprises titrating the carbon nanotube with nanocrystals.

In another aspect of the invention, a method of passivating defect sites on a carbon nanotube is provided. The method comprises adding nanocrystals to a carbon nanotube. The nanocrystals form covalent linkages with the defect sites thereby passivating the defect sites. Thus, the conductance of the nanotubes can be improved.

In one embodiment, the methods of localizing/quantifying defect sites on a nanotube comprise the methods of making heterostructures which comprise quantum dot nanocrystals, as described above. In another embodiment, the methods of localizing/quantifying defect sites on a nanotube comprise the methods of making heterostructures which comprise metal oxide nanocrystals, as described above. In another embodiment, the methods of localizing/quantifying defect sites on a nanotube comprise the methods of making heterostructures which comprise elemental metal/semi-conducting nanocrystals, as described above.

EXAMPLES

Example 1

Synthesis of Multiwalled Nanotube Heterostructures Comprising CdTe Nanocrystals

Multiwalled nanotubes (MWNTs) were obtained from MER Corporation. An aggressive functionalization protocol was used to remove almost all of the metal impurities (such as iron) and a substantial portion of the amorphous carbon entities in the sample (Hiura et al. *Adv. Mater.* (Weinheim, Ger.) 7:275 (1995). In essence, a vigorous $KMnO_4/H_2SO_4$ treatment was followed by successive processing with solutions of 35% HCl and 10% HF. The purified tubes were then extensively washed with distilled water and heated at 150° C. in a drying oven. XPS analysis, coupled with EDS data, have indicated that any remaining metal was below detectable limits.

This, rigorous functionalization protocol opens and derivatizes most of the nanotube ends as well as attacks occasional defect sites at the sidewalls (Hirsch, A. *Angew. Chem., Int. Ed.* 41:1853 (2002) and Banerjee et al. *Chem. Eur. J.* 9:1898 (2003)). The generated functional groups are expected to be a mixture of carboxylic acids, alcohols, and ketones (Hiura et al.). These functionalized, oxygenated nanotubes were used as ligands and as templates to grow CdTe nanocrystals. In a modification of a procedure developed by Peng et al. to synthesize high-quality CdTe nanocrystals using a one-pot approach with CdO, MWNTs were mixed with CdO and tetradecylphosphonic acid (TDPA) and then were heated to 320° C. in trioctylphosphine oxide (TOPO) under argon with vigorous stirring (Peng et al., *J. Am. Chem. Soc.* 123:183 (2001); and Peng et al., *J. Am. Chem. Soc.* 124:3343 (2002)). A substoichiometric amount of TDPA was used so that some of the Cd could coordinate to the oxygenated functional groups (especially carboxylic acid and alcohol groups) localized on the MWNT surface.

A Te solution in trioctylphosphine (TOP) was then injected at 300° C., and the crystals were allowed to grow at 250° C. After a 20 min growth period, the heating source was removed. Upon cooling to 50° C., 5 mL of toluene was added to the reaction mixture, and nanocrystals were recovered through precipitation initiated by addition of methanol. The solid residue, which included functionalized tubes as well as CdTe nanocrystals not attached to the tubes, was filtered over a 0.2 μm PTFE membrane. CdTe nanocrystals, not bound to the tubes, were washed away by using copious amounts of toluene. Only functionalized heterostructures were retained on the membrane, and these were dried and used for further characterization.

Electron Microscopy.

Samples for TEM and HRTEM were obtained by drying sample droplets from an ethanolic solution onto a 300 mesh Cu grid covered with a lacey carbon film. A Philips CM12 TEM, equipped with EDAX capabilities, was used at an accelerating voltage of 120 kV for low-resolution imaging. High-resolution images were obtained on a JEOL 2010F HRTEM, equipped with an Oxford INCA EDS system, at an accelerating voltage of 200 kV. SEM samples were drop dried onto Cu grids and held over a Be plate inside a homemade sample holder. Samples were imaged on a Leo 1550 field emission instrument using accelerating voltages of 2–10 kV at a 2 mm working distance.

X-ray Photoelectron Spectroscopy.

The samples were attached to stainless steel holders using conductive double-sided tape and placed in the vacuum chamber of a model DS800 XPS surface analysis system (Kratos Analytical Plc, Manchester, United Kingdom). The chamber was evacuated to a base pressure of $\sim 5 \times 10^{-9}$ torr. A hemispherical energy analyzer was used for electron detection. XPS spectra were first collected using a Mg Kα X-ray source at 80 eV pass energy and at 0.75 eV steps. High-resolution spectra were collected at a pass energy of 10 eV and in 0.1 eV steps.

X-ray Diffraction.

Powder X-ray diffraction spectra were collected on a Scintag diffractometer, operating in the Bragg configuration using Cu Kα ($\lambda=1.54$ Å) radiation.

Optical Spectroscopy.

UV-visible spectra were obtained at high resolution on a Thermospectronics UV1 using quartz cells with a 10-mm path length. UV-visible spectra were obtained for CdTe nanocrystals, dissolved in toluene, and for the nanotube-nanocrystal heterostructure, dispersed by sonication in DMF. Infrared spectra were obtained, using a ThermoNicolet Nexus 670 using a ZnSe single reflectance ATR accessory. Samples for Raman spectroscopy were analyzed on a Jasco Ventuno micro-Raman instrument, with a 200 micron confocal aperture, at a diode laser excitation of 785 nm using a power of 10 mW.

Microscopy Characterization.

Figure 1B:
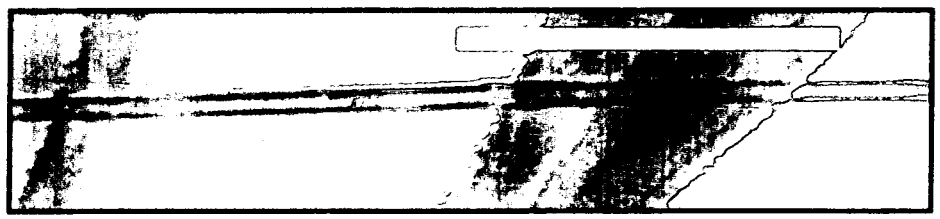
Figure 1C:
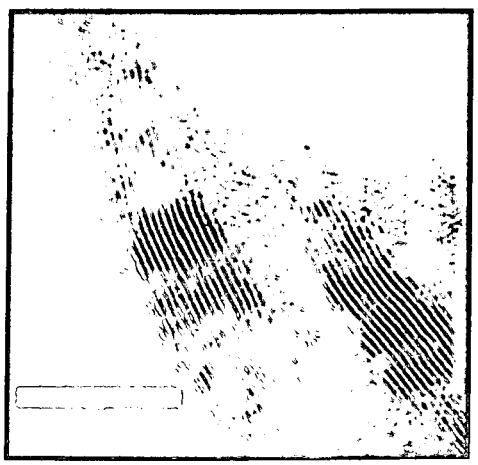
Figure 1D:
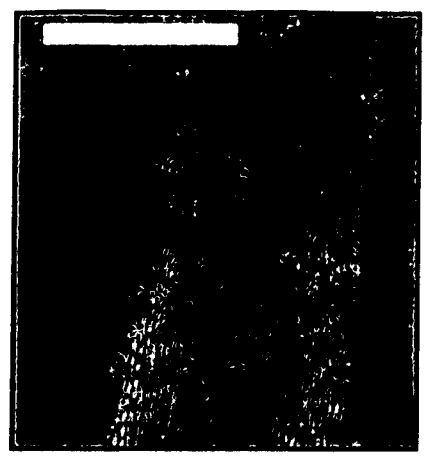
Figure 2A:
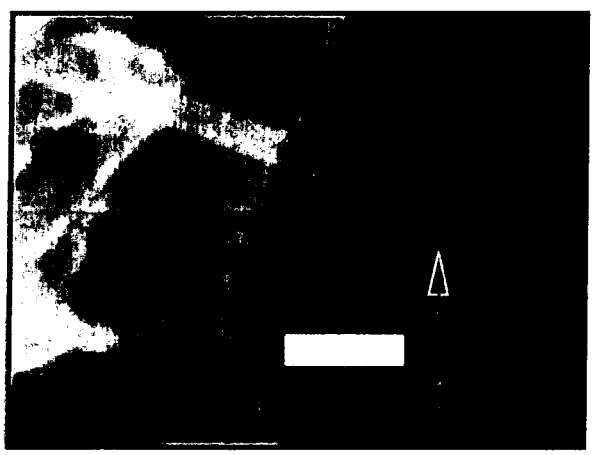
FIG. 2. (a) Scanning electron micrograph (SEM) of a particle grown near the tip of the tube. (b) SEM image of a nanocrystal-mediated junction with carbon nanotube bundles. Arrows point to CdTe. Scale bars for SEM images are 100 to 200 nm, respectively. Presence of CdTe was confirmed by EDS signals for Cd and Te. Parts c–e show transmission electron microscopy images. (c) Sidewall coverage of quantum dots on a MWNT bundle. (d) CdTe nanocrystals on nanotube sidewalls, with some near the tip edge. (e) Nanocrystal-mediated nariotube junctions indicated by arrows. Scale bars for TEM images are 180, 75, and 112 nm, respectively.
Figure 2B:
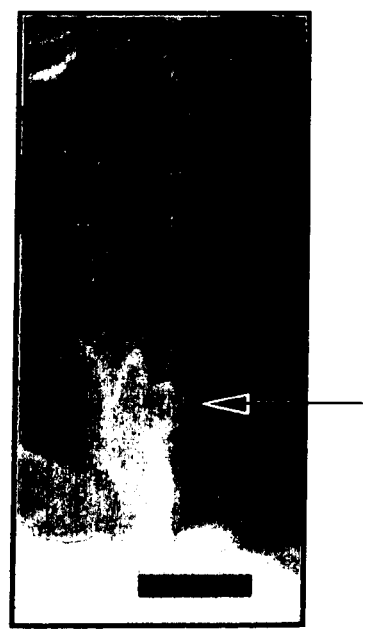
Figure 2C:
Figure 2D:
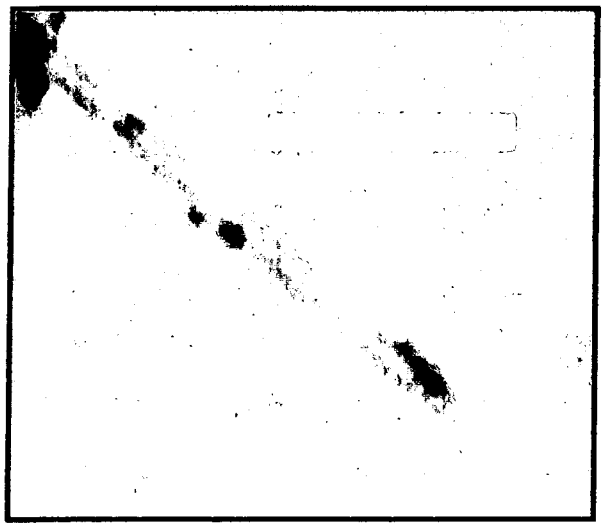
Figure 2E:
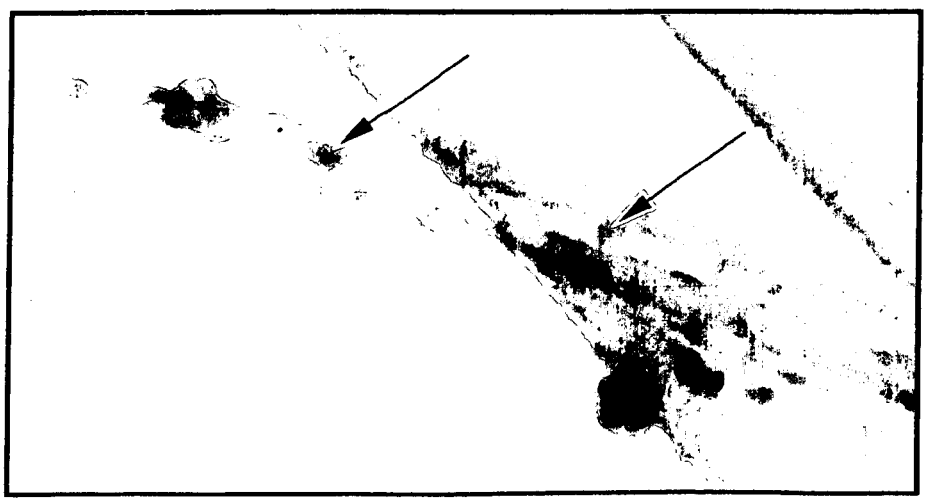

FIG. 1 shows TEM images of the initial building blocks, namely purified and oxidized MWNTs (FIG. 1b). Pristine, unoxidized tubes are shown in FIG. 1a. The aggressive oxidation regime described can open the caps of the MWNTs (FIG. 1c) as well as partially oxidize and remove some of the outer layers of the tubes (FIG. 1d). This acid oxidation is able to etch away at the tube's outer walls and at defect sites. The clearly visible, serrated edges of the walls (FIG. 1d) and the open ends (FIG. 1c) of these processed tubes, observed in the HRTEM images, have dangling bonds and oxygenated functional groups, which are then able to act as ligands for the growth of CdTe nanocrystals. The presence of serrations in processed tubes stands in sharp contrast to the highly crystalline graphite lattice seen in the unpurified MWNT sidewalls in FIG. 1a. The absence of any extraneous catalyst particles in these purified tubes was confirmed by XPS and EDS analyses.

FIG. 2 displays SEM and TEM images of CdTe-MWNT nanoheterostructures. Especially notable is the contrast between the "clean" tube image, seen in FIG. 1b, and the functionalized heterostructure, visible in parts c and d of FIG. 2. Parts a and d of FIG. 2 show a relatively higher density of particles near the MWNT tip. Functionalization at these sites on the nanotube is more facile because of the abundance of oxygenated functional groups which can nucleate the growth of nanocrystals. The high density of functional groups at these sites is due to the curvature-induced increased reactivity at positions close to the tip (Ajayan et al., Nature 361:333 (1993). After tip opening, acid etching can destroy most of the outermost walls of the MWNT close to the tip (Yao et al., J. Mater. Res. 13:2432 (1998)). An analogous high density of nanocrystal attachment at nanotube ends through reactions mediated by covalent, amidation chemistry have been noted (Banerjee et al., Nano Lett. 2:195 (2002) and Ravindran et al., Nano Lett. 3:447 (2003)). However, because of the use of a more aggressive oxidation regime in this example, derivatization is not limited simply at the ends of the tubes (Ravindran et al.). FIG. 2 demonstrates significant tethering of nanocrystals to the MWNT sidewalls.

Parts b and e of FIG. 2 demonstrate the versatility of the in situ growth technique in the construction of nanoscale junctions, composed of nanotubes, adjoined by interceding nanocrystals. In contrast, covalent attachment, mediated by carbodiimide, typically yields only isolated, randomized nanotube-nanocrystal heterostructures (Banerjee et al., Nano Lett. 2:195 (2002) and Ravindran et al., Nano Lett. 3:447 (2003)). The expected presence of Cd, Te, and P, originating as a secondary ligand from TDPA, in the heterostructures in this example was confirmed by EDS analysis.

Figure 3A:
FIG. 3. (a) High-resolution TEM images of CdTe nanocrystals grown on a MWNT surface. Inset shows a different nanotube-nanocrystal composite. Scale bars are 5 nm in both cases. (b) An elongated CdTe nanocrystal grown at the opened tip of a MWNT. Arrow indicates site of attachment between the nanotube and nanocrystal. (c) CdTe nanocrystal grown at a defect site. Arrows circumscribe a defect site where acid has etched through a few layers of the external sidewall. (d) Quantum dots grown from the serrated edges and etched sidewalls of the MWNT. Arrows depict ends of the walls where the crystals likely have nucleated. Scale bars for high-resolution data in parts (b) through (d) are 20, 5, and 10 nm respectively.
Figure 3B:
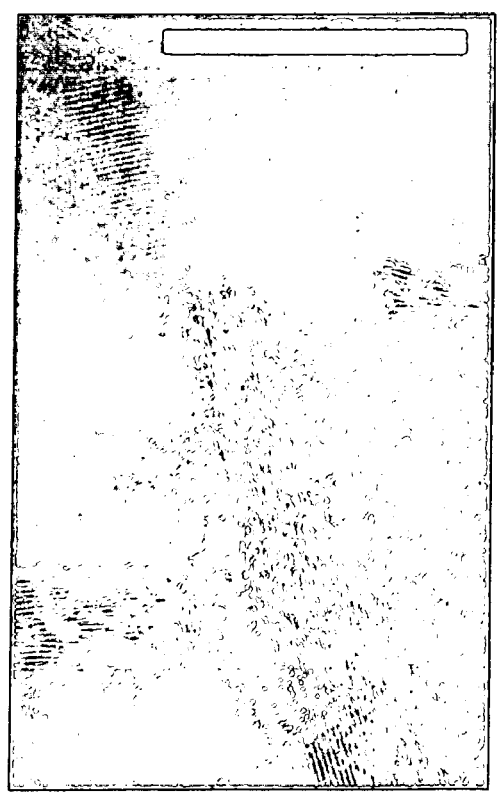
Figure 3C:
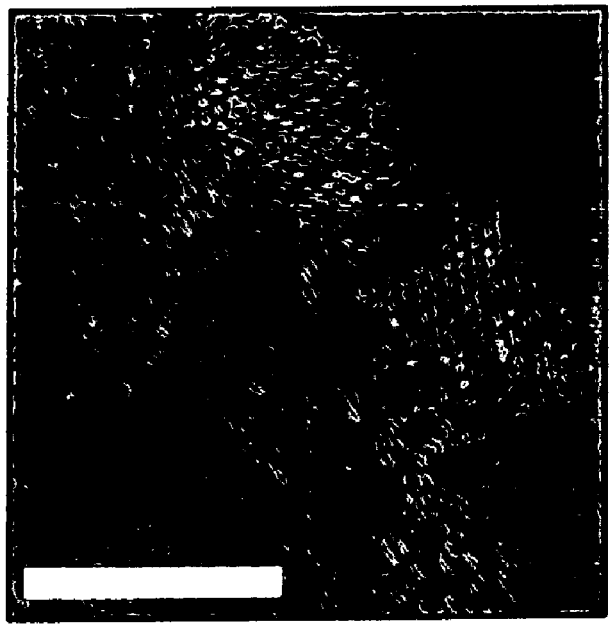
Figure 3D:
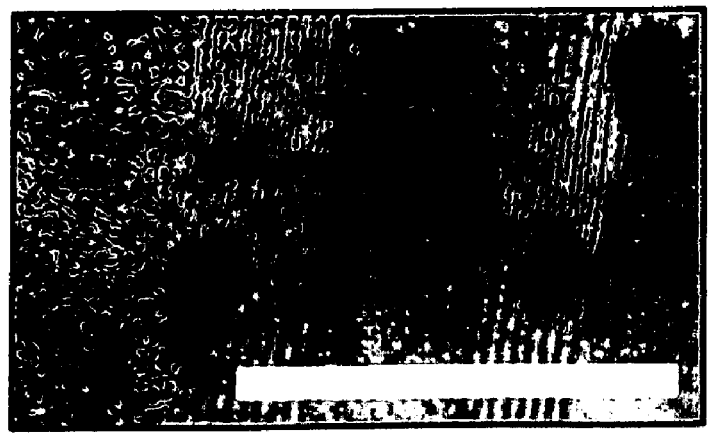

High-resolution TEM images show well-defined lattice fringes for CdTe nanocrystals, grown on the tube walls as seen in FIG. 3a, forming clear interfaces. The crystals are predominantly wurtzite in structure, though at least some of these crystals appear to be of the cubic zinc blende morphology. The HRTEM images in FIG. 3 lend useful insight into possible mechanisms of CdTe nanocrystal growth at the tube ends and surface edges, where there is preferential attachment of these crystals. FIG. 3b shows an irregularly shaped CdTe crystal, grown at the open tip edge of a MWNT, all of which are lying on top of a carbon film. FIG. 3c illustrates nanocrystals grown from a defect site at an apparent discontinuity on the nanotube sidewall. The acid seems to have etched through several, layers of the sidewall. Another common motif is the presence of nanocrystals attached to the outermost, exposed edges of the tubes, as observed in FIG. 3d as well as in the inset to FIG. 3a. Hence, these areas, including the tips of the MWNTs, are particularly susceptible to oxidative attack, are richly populated with oxygenated functional groups, and are thereby able to act as nucleation sites for the growth of nanocrystals.

The elongated shape of the nanocrystal, evident in FIG. 3b, can be explained by a diffusion-limited growth process (Peng et al., J. Am. Chem. Soc. 123:1389 (2001)). The MWNT limits access to one face of the growing crystallite, and the incoming monomer flux adds preferentially onto the other free end, thereby inducing a pseudo-one-dimensional growth for the crystal. This apparent control over resulting nanocrystal shape can be attributed to a steric effect due to the bulky nanotube ligand, a phenomenon which has also been noted in molecular coordination complexes of nanotubes (Banerjee et al., Nano Letter, 2:49 (2002) and Banerjee et al., *J. Am. Chem. Soc.* 124:8940 (2002)). In other words, the nanotube influences directional diffusion of the monomer.

Figure 4A:
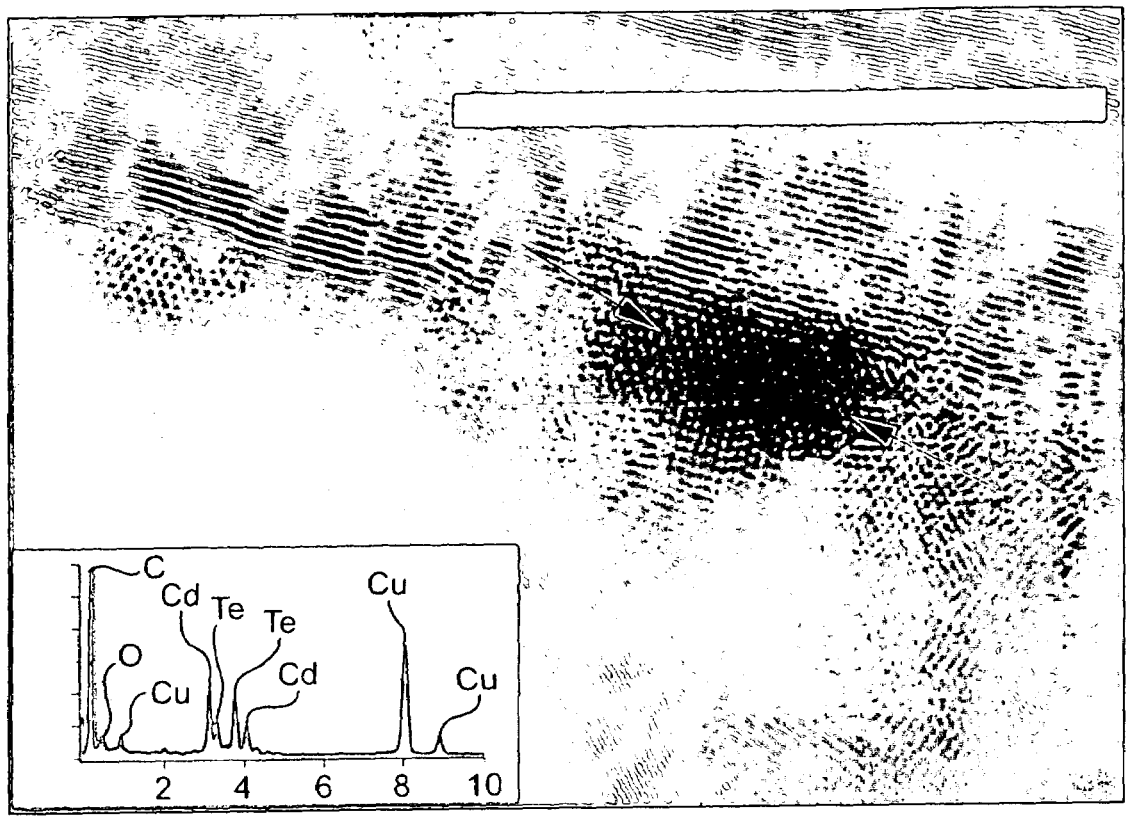
FIG. 4. (a) High-resolution TEM image of a junction with a nanocrystal in the middle of and attached to two nanotube bundles. Sets of arrows define irregularly shaped nanocrystals. Inset shows an EDS spectrum of the nanotube-nanocrystal hetrostructure. Horizontal axis is energy in eV. (b) and (c) High-resolution TEM images demonstrate extensive sidewall coverage of in situ nanocrystals. Scale bars are 20, 10, and 10 nm respectively.
Figure 4B:
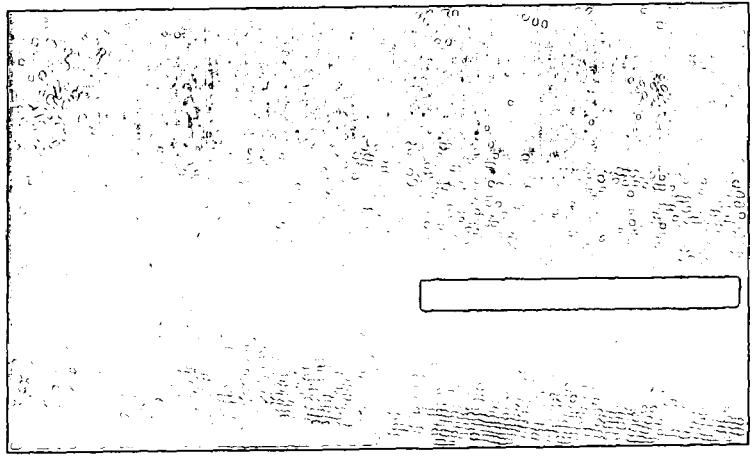
Figure 4C:
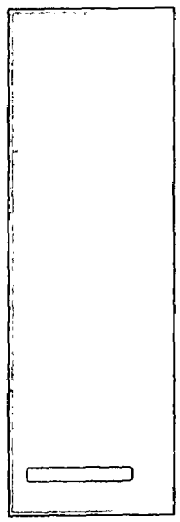

Parts *b* and *c* of FIG. 4 show a high density of nanocrystals grown on MWNT sidewalls. "Free" nanocrystals, washed away during sample workup, are relatively monodisperse in size and shape (quasi-spherical, 5 nm) because they originate predominantly from growth processes involving primarily cadmium-phosphonic acid precursors (Peng et al. *J. Am. Chem. Soc.* 124:3343 (2002)). In contrast, nanocrystals grown on the surfaces of the tubes are strongly affected by the nanotube ligand. The large variation observed in the shape and size of these latter nanocrystals likely arises from factors such as functional group density at a particular site, the geometry of the site (the spatial location on the tube and the ability of MWNTs to control diffusion of the monomer flux), and the physical distance separating functional groups on the same tube or on adjacent tubes. The length of the long axis of these in situ-grown nanocrystals ranges from 1 to 9 nm, and the aspect ratio varies from 1 to 5. The spacing between tubes would be responsible for the junctions observed in parts *b* and *e* of FIG. 2 and at high resolution in FIG. 4a.

From all these microscopy results, it is evident that nanotube-nanocrystal heterostructure formation is chemically mediated. Oxidized nanotubes essentially act as a template for the in situ growth of quantum dots, effectively controlling the shape and size of the nanocrystals thereby formed. In control experiments, quantum dot growth experiments were performed with pristine, raw, and mildly oxidized tubes. The extent of functionalization of nanotubes with nanocrystals correlates, in large measure, with the degree of tube oxidation. In particular, an aggressive oxidation regime enables a high surface coverage of quantum dots on the ends as well as at numerous sites on the sidewalls. Few, if any, nanocrystals were observed coordinated to pristine, unoxidized nanotubes. The results in this example correlate with highly oxidized MWNTs containing ~5–6 atomic % oxygen content as determined by XPS. In contrast, mildly oxidized MWNTs, with oxygen contents of ~1–2 atomic %, showed very sparse coverage of coordinated nanocrystals.

Additional Structural Characterization.

Figure 5A:
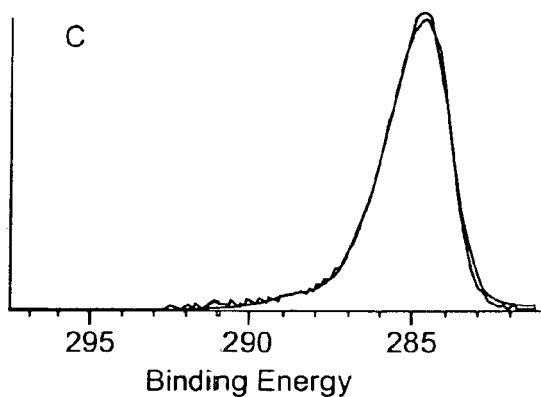
FIG. 5A. High-resolution XPS spectra for C 1s signals. Bottom axis represents binding energy (in eV). Vertical axis is intensity in arbitrary units.
Figure 5B:
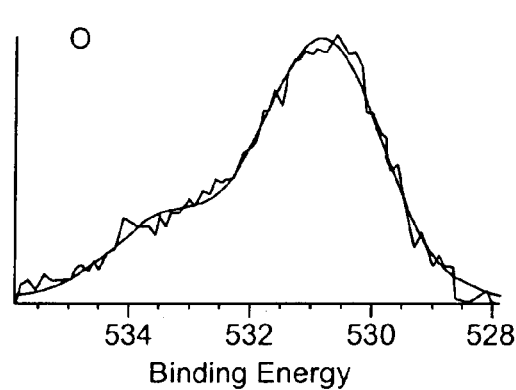
FIG. 5B. High-resolution XPS spectra for O 1s signals. Bottom axis represents binding energy (in eV). Vertical axis is intensity in arbitrary units.
Figure 5C:
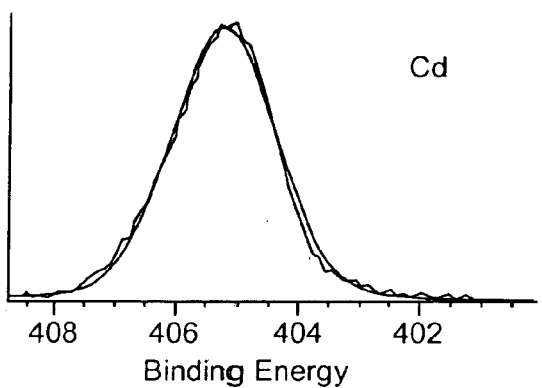
FIG. 5C. High-resolution XPS spectra for Cd $3d_{5/2}$ signals. Bottom axis represents binding energy (in eV). Vertical axis is intensity in arbitrary units.
Figure 5D:
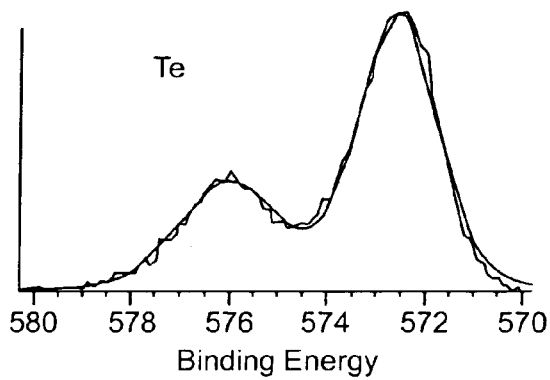
FIG. 5D. High-resolution XPS spectra for Te $3d_{5/2}$ signals. Bottom axis represents binding energy (in eV) Vertical axis is intensity in arbitrary units.
Figure 5E:
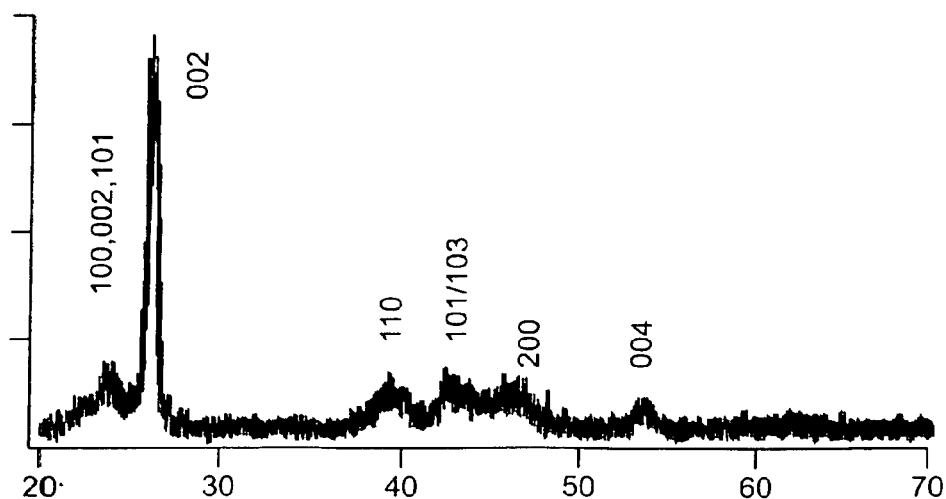
FIG. 5E. X-ray diffraction pattern for CdTe-MWNT heterostructure. Vertical axis is intensity in arbitrary units. Horizontal axis is $2\theta$. Peaks indexed in black correspond to wurtzite CdTe, whereas those labeled in red are associated with MWNTs. The presence of zinc blende-stacking faults, as well as some zinc blende crystals, is also likely. However, these zinc blende peaks are very near to those of wurtzite and, hence, may overlap.

Further confirmation for heterostructure formation comes from analysis of XRD and XPS measurements. XRD indicates that the predominant crystal structure is wurtzite, although some contribution from zinc blende-stacking faults as well as from zinc blende nanoparticles is also expected. Associated peaks have been indexed (FIG. 5E). The peaks are broadened with respect to analogous bulk data because of the finite size of the particles. XPS measurements (FIGS. 5A–D) also establish the formation of CdTe on the nanotube surface. The $C_{1s}$ high-resolution peak shows conspicuous asymmetry, including a pronounced contribution from the high binding energy side, corresponding to the presence of carboxylic acids and carboxylate-like surface structures. The Cd $3d_{5/2}$ peak, shown at high resolution, can fit perfectly to CdTe with a binding energy of Cd at 405.22 eV. The $TeO_3$ peaks, ascribed to Te $3d_{5/2}$, attest to formation of species due to inadequate surface passivation of the CdTe. The number of nanotubes that can coordinate to the nanocrystal surface is physically constrained by the intrinsic bulk of the tube. Thus, under ambient conditions and upon prolonged exposure to air, some decomposition will take place, as with most quantum dots, because of the formation of surface species such as $TeO_3$. This process is further hastened at higher temperatures. Heating can also remove the carboxyl groups on the MWNTs themselves, although not completely until approximately 350° C. The intrinsic structures of nanotubes and of the resulting nanocrystals, however, are expected to remain intact to such temperatures.

Figure 6:
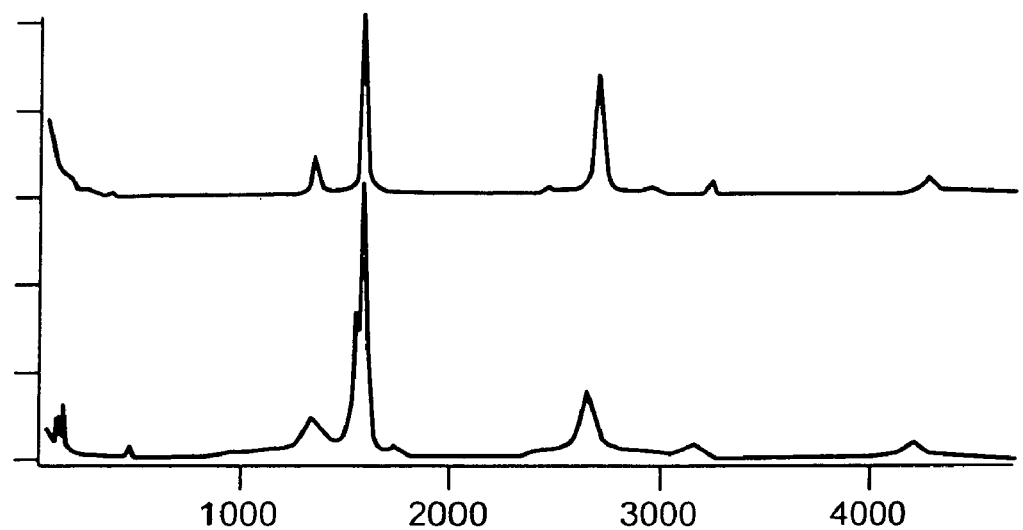
FIG. 6. Raman spectra. Horizontal axis is in wavenumbers. Vertical axis is intensity in arbitrary units. Top spectrum is associated with oxidized and purified MWNTs used as a precursor to the heterostructure formation. Lower figure is a Raman spectrum of the CdTe-MWNT heterostructure product.

Raman scattering measurements (FIG. 6) are also consistent with the formation of the confined CdTe cluster. Raman spectra for the heterostructure at 785 nm excitation show an expected longitudinal optic (LO)-type band with a peak at 166 $cm^{-1}$, which is missing from the Raman spectra of the precursor MWNTs. The downshift and broadening of this mode from the bulk peak, occurring at 170 $cm^{-1}$, has been previously observed in Raman scattering studies on CdTe clusters (Rolo et al., *Phys. Status Solidi B* 229:433 (2002)). Raman spectra of the precursor sample and the MWNT-CdTe heterostructure show bands characteristic of nanotubes, namely the high-frequency G modes (Rao et al., *Science* 275:187 (1997)) near ~1590 $cm^{-1}$ and a weaker disorder mode peak at 1290–1320 $cm^{-1}$ (D band).

Figure 7:
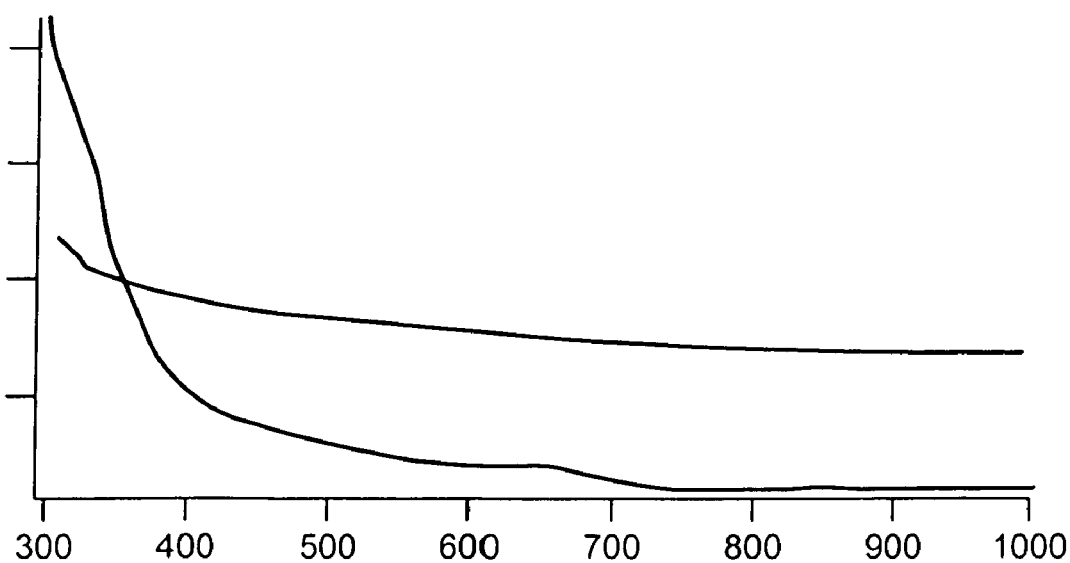
FIG. 7. Electronic spectra. Horizontal axis represents wavelength (in nm). Vertical axis is intensity in arbitrary units. The lower spectrum is taken of CdTe washings. The upper spectrum is associated with the CdTe-MWNT heterostructure.
Figure 8:
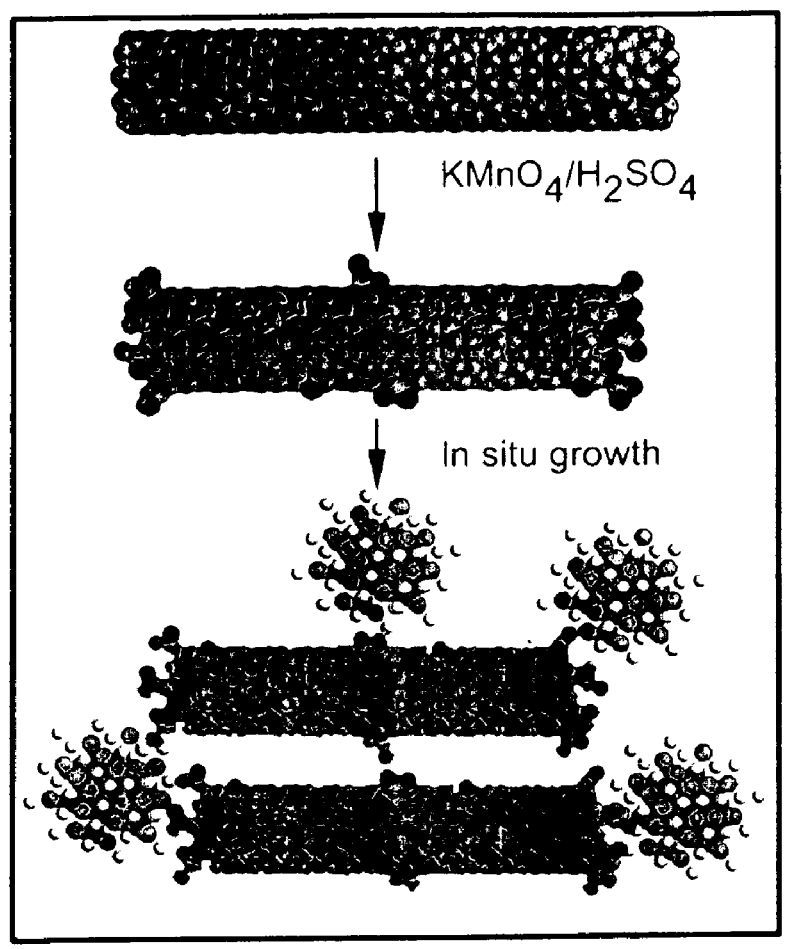
FIG. 8. Schematic illustrating various steps in the growth of the nanotube-nanocrystal heterostructure. Pristine nanotubes are oxidized to generate functional groups at the nanotube ends and at a few defect sites. CdTe nanocrystals are then grown in situ by coordination of Cd and injection of a Te solution as described in the Examples Section. TDPA ligands to the CdTe are omitted for the sake of clarity. Structures for junctions between multiple tubes are also depicted.
Figure 9A:
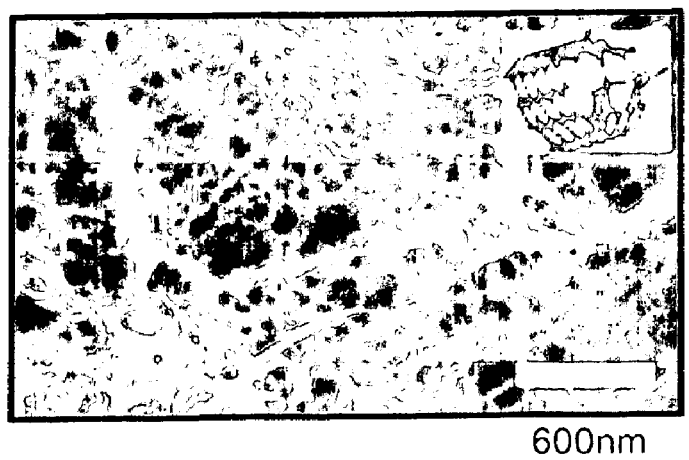
FIG. 9. SEM images at 2–10 keV. a) SEM image of ozonized nanotubes. Inset shows an optimized geometry of a (5,5) sidewall-ozonized SWNT. b) SEM of CdTe-SWNT heterostructures, depicting extensive sidewall coverage of the tubes with nanocrystals. c) SEM image of a single bundle including a nanocrystal mediated junction (arrow) in the upper right hand corner. Expected elemental signatures of Cd and Te were noted. d) AFM height image of nanocrystal-mediated junctions (arrows). e) AFM height image of a tube bundle, functionalized at ends and sidewalls with CdTe nanocrystals (arrows show selected quantum dots). Images obtained in tapping mode using Si tips (k=1–5 $Nm^{-1}$) at resonant frequencies of 50–75 kHz.
Figure 9B:
Figure 9C:
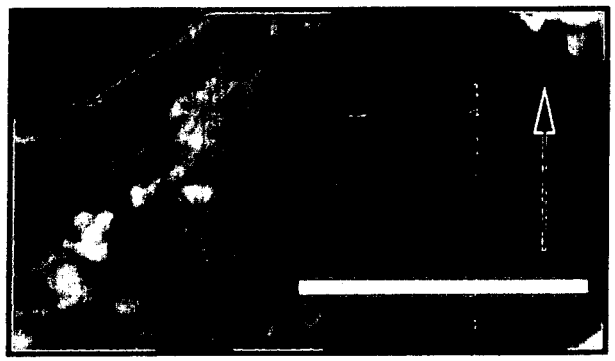
Figure 9D:
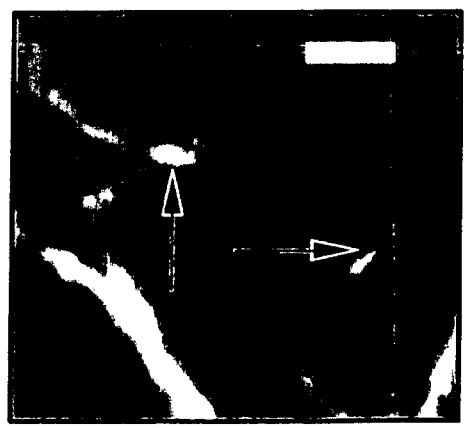
Figure 9E:
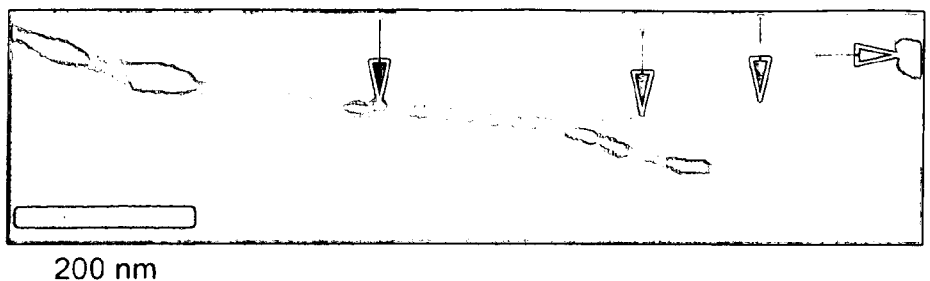
Figure 10A:
FIG. 10. High-resolution TEM images at 200 keV. a) Ozonized nanotubes; b) nanocrystal-mediated nanotube junctions; c) sidewall functionalization of nanotube bundle with an elongated nanocrystal. d) A nanocrystal-mediated junction of three nanotube bundles. e) EDS spectrum of (d). Horizontal axis represents binding energy (in eV). f) Extensive sidewall functionalization with nanocrystals.
Figure 10B:
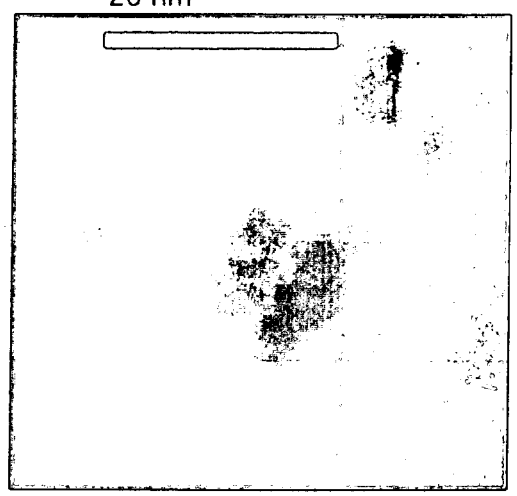
Figure 10C:
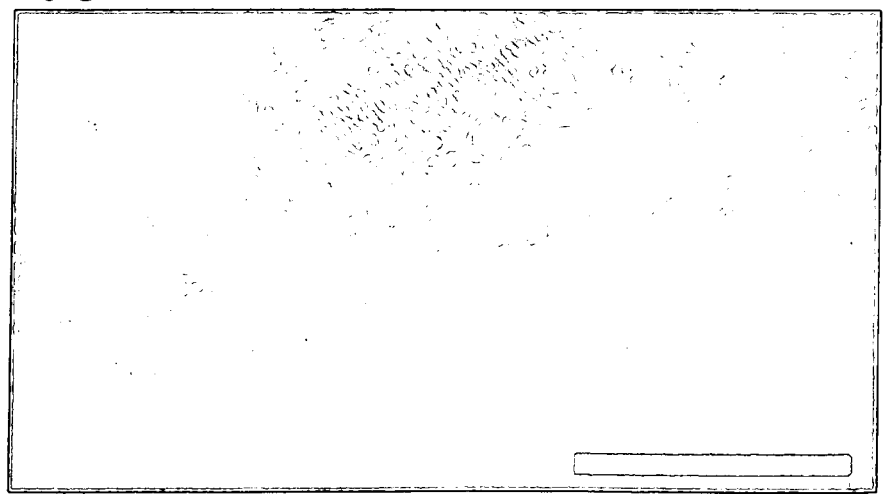
Figure 10D:
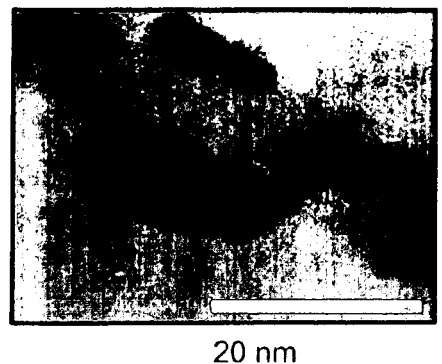
Figure 10E:
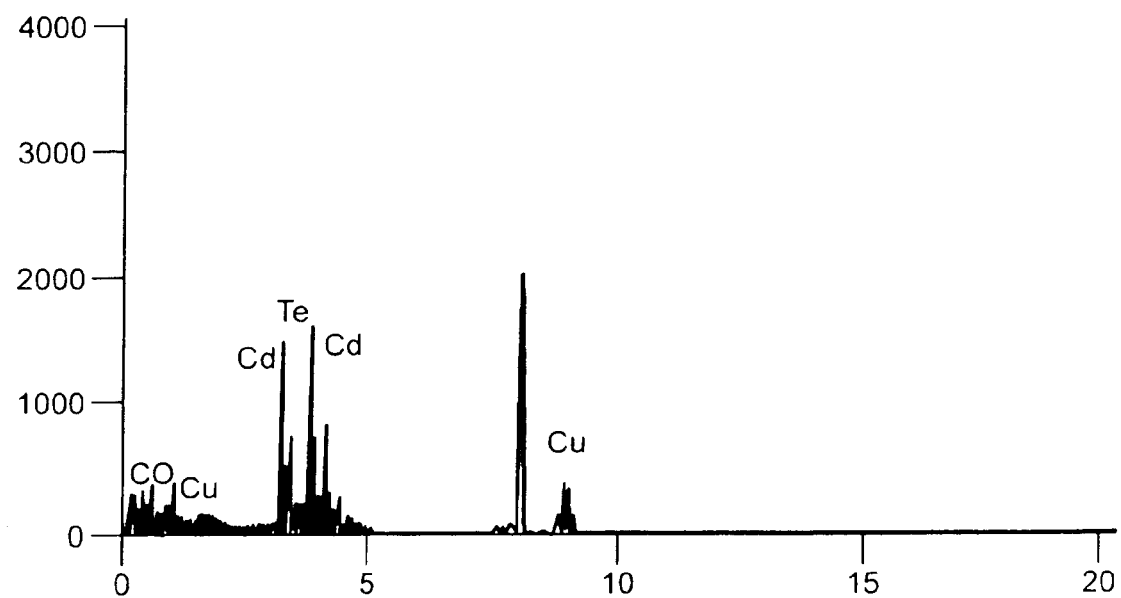
Figure 10F:
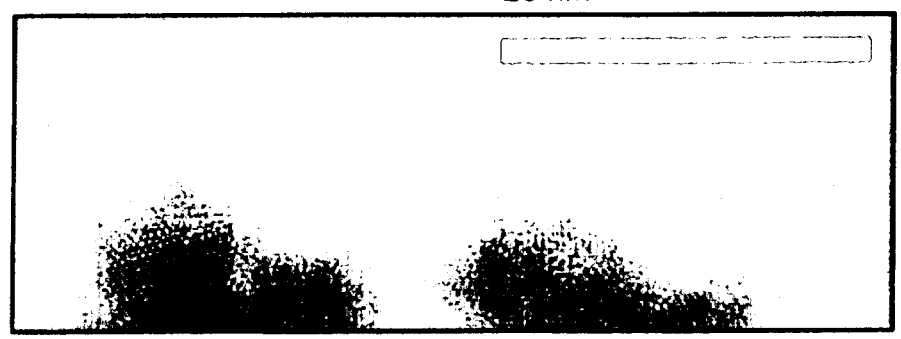
Figure 11A:
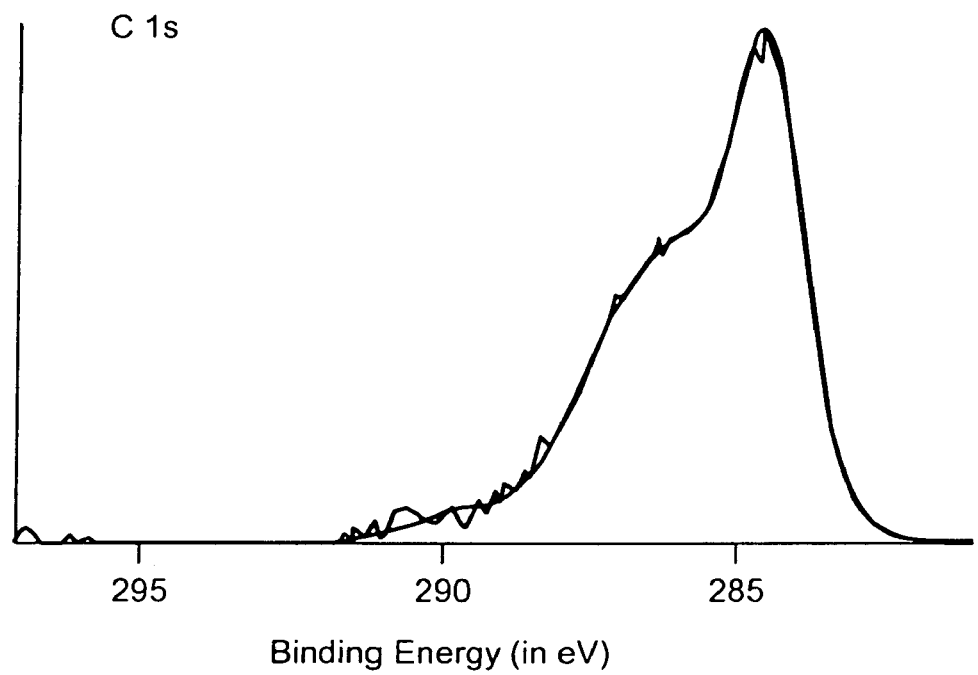
FIG. 11A. High-resolution XPS spectra for C 1s signals. The left axis represents intensity.
Figure 11B:
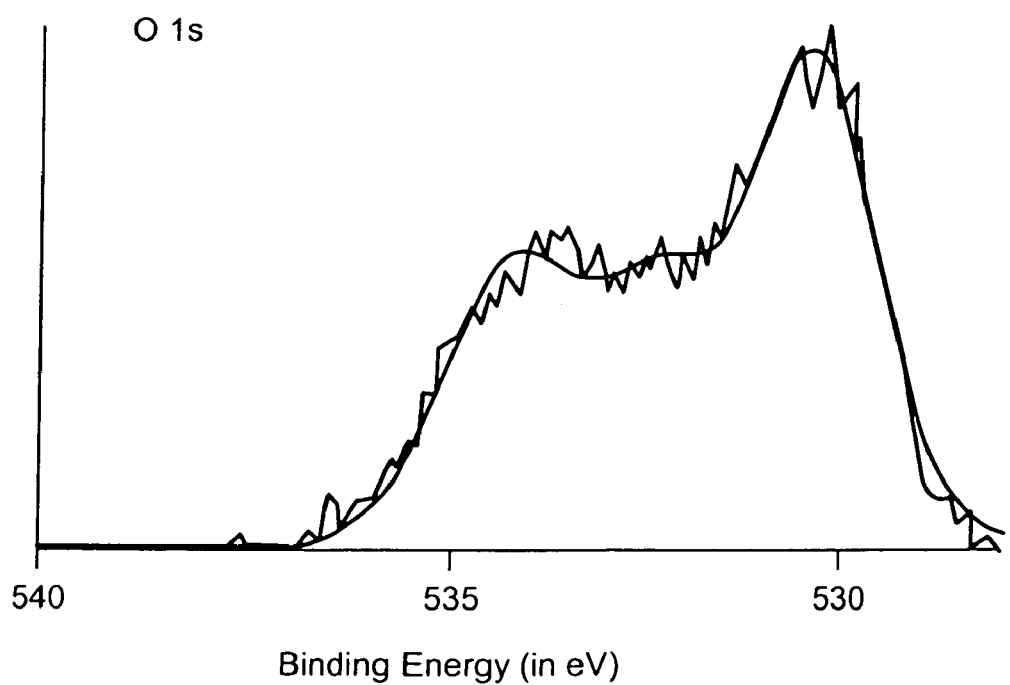
FIG. 11B. High-resolution XPS spectra for O 1s signals. The left axis represents intensity.
Figure 11C:
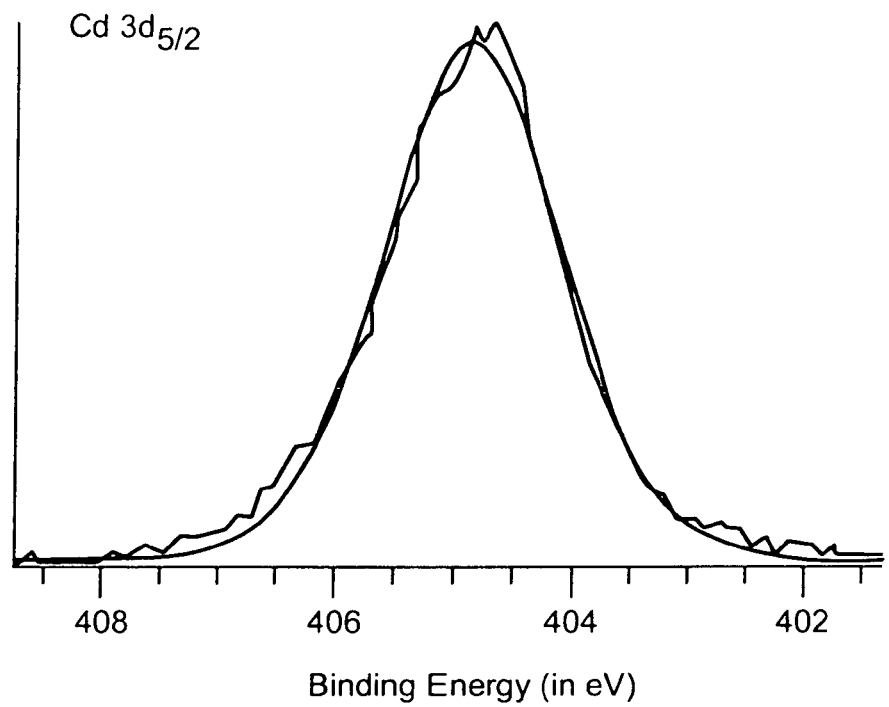
FIG. 11C. High-resolution XPS spectra for Cd $3d_{5/2}$ signals. The left axis represents intensity.
Figure 11D:
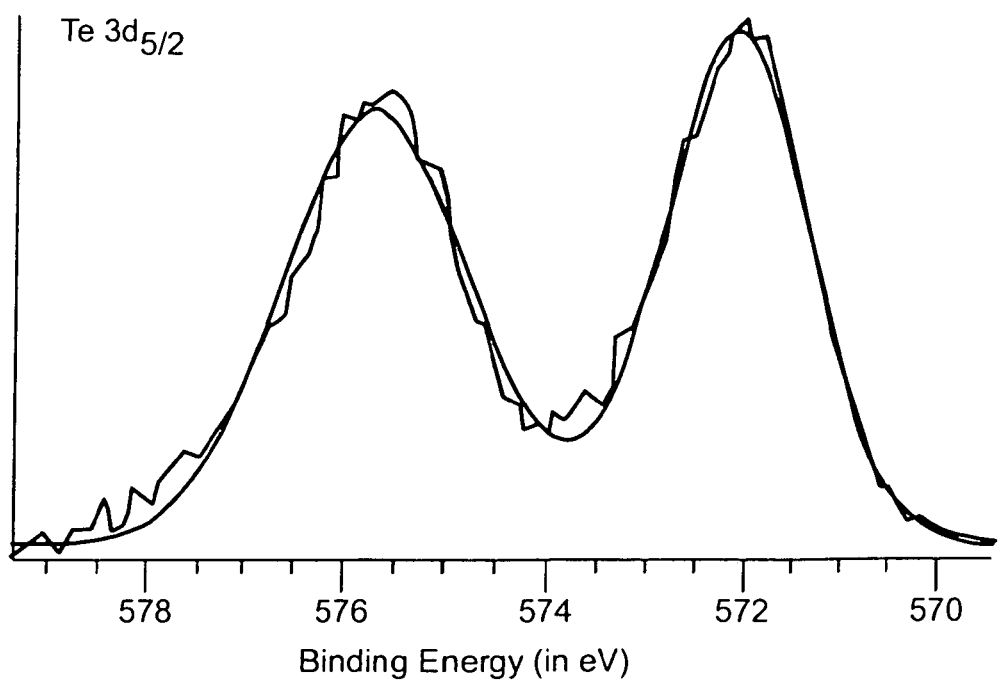
FIG. 11D. High-resolution XPS spectra for Te $3d_{5/2}$ signals. The left axis represents intensity.
Figure 11E:
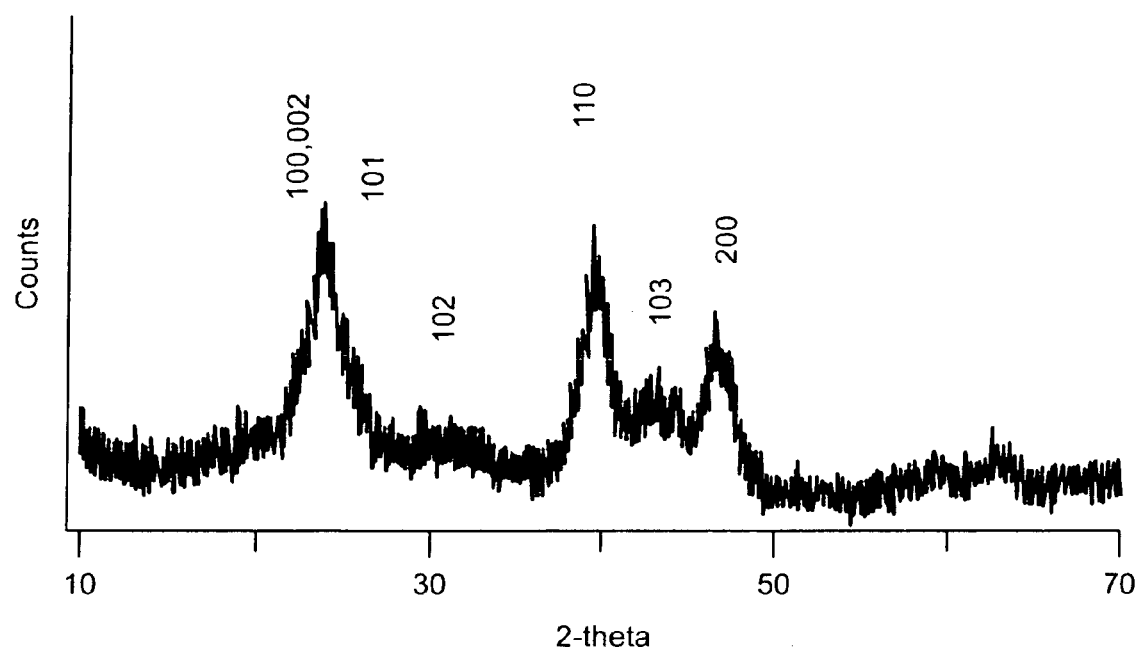
FIG. 11E. XRD pattern of a CdTe-SWNT heterostructure. The wurtzite form of CdTe has been indexed.

The electronic spectrum (FIG. 7) of the nanotube-adduct is featureless, and no CdTe exciton can be resolved. This is likely due to both the large background absorbance of the nanotube, and the large variation in size and shape of the nanocrystals attached to the MWNT surface, as described previously. The spectra of the toluene washings also show a lower degree of monodispersity for these nanocrystals relative to those quasi-spherical nanocrystals (~5 nm), grown without nanotubes as ligands. Thus, MWNTs likely affect the growth of a portion of the washed-away crystals. Without wanting to be bound by a theory, it is believed that nanocrystallites come loose from the nanotubes at various stages of their growth process, thereby accounting for the larger heterogeneity in quantum dot size observed. This is a further indication that functionalized nanotubes provide a spatially constraining template that favors one-dimensional growth (Peng et al., *J. Am. Chem. Soc.* 123:1389 (2001)) and, hence, anisotropic quantum dot formation.

Example 2

Synthesis of Single-Walled Nanotube Heterostructures Comprising CdTe Nanocrystals Nanotubes were ozonized and oxidized as described in Banerjee et al. *J. Phys. Chem B* 106:12144 (2002).

CdO was dissolved in TOPO at 320° C. in the presence of ozonized, oxygenated, and sidewall-functionalized HiPco (high-pressure CO conversion) SWNTs. A substoichiometric amount of tetradecylphosphonic acid (TDPA) was used so that some of the Cd precursor could complex with the tube surface. A solution of tellurium in trioctyl phosphine was rapidly injected at 270° C. and the QDs were allowed to grow at 250° C. under vigorous stirring for 1–20 min. In subsequent workup and purification, toluene was added at 50° C., followed by methanol, which precipitated CdTe nanocrystals in solution. After filtration over a 0.2 μm poly(tetrafluoroethylene) (PTFE) membrane and extensive washing with toluene to remove all unattached nanocrystals, the remaining dark residue was then dried and characterized by low-and high-resolution transmission electron microscopy (TEM, Philips CM 12 and JEOL 2010 apparatus), AFM (Digital Instruments Multimode Nanoscope IIIa), SEM (LEO 1550 apparatus), X-ray diffraction (Scintag apparatus with Cu Kα=1.54 Å), XPS (Kratos Analytical DS800 apparatus with a Mg Kα source), UV-vis-IR (ThermoSpectronics UV1 and ThermoNicolet Nexus 870 apparatus), and Raman spectroscopy (Jasco Ventuno microRaman apparatus at 10 mW power).

Characterization

FIG. 9 shows a high degree of QD immobilization achieved with ozonized tubes. Ozonation (FIG. 9a) is able to remove most Fe catalyst particle impurities, intrinsic to raw tubes (Banerjee et al., J. Phys Chem. B 106:12144 (2002)). Energy dispersive X-ray spectroscopy (EDS) measurements of the synthesized heterostructure in the scanning electron microscope (SEM) showed primarily Cd and Te signals, suggesting that the vast majority of the particles observed on the nanotube surface are CdTe particles. "Fused" interconnects and junctions, some of which may be due to two or more functionalized nanotubes acting as surface ligands of the same nanocrystal, of these nanostructures were observed and further corroborated by atomic force microscopy (AFM) images of the identical adduct samples.

CdTe nanoparticles formed on the nanotube surface were crystalline, as can be observed from the well-resolved lattice fringes in FIG. 10. The predominant crystal structure is wurtzite, with some zinc blende crystals. EDS analysis, at high resolution, showed only Cd and Te present, apart from C and O.

The varying shapes of CdTe nanocrystals observed indicate that the functionalized nanotubes influence the size, shape, and growth of the nanocrystals. FIG. 10 shows several anisotropic, rod-shaped crystals, immobilized on tubes, in contrast with quasi-spherical CdTe QDs grown in solution that are not attached to nanotubes.

Additional evidence for the formation of CdTe on the nanotube surface comes from X-ray diffraction (XRD) and X-ray photoelectron spectroscopy (XPS) measurements (FIG. 11). XRD is consistent with a wurtzite structure for the crystallites. A signal contribution from zinc blende stacking faults or individual zinc blende particles is also possible. From XPS measurements, the C 1s high-resolution peak displays asymmetry, including a pronounced contribution from the high binding energy side corresponding to carboxylic acids and carboxylate-like surface structures on the ozonized tubes. $TeO_3$ peaks in the Te $3d_{5/2}$ spectra indicate inadequate surface passivation of the CdTe.

Figure 12A:
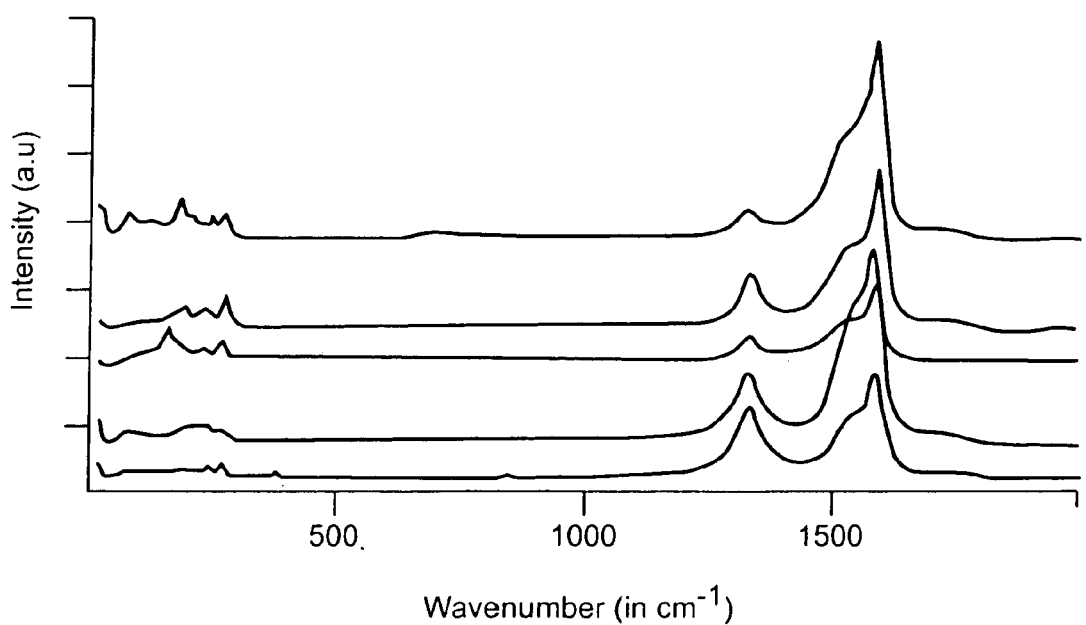
FIG. 12. a) Raman spectra of ozonized SWNTs at laser excitations of 785 (green) and 532 nm (blue), respectively. Raman spectra of a CdTe-SWNT heterostructure, collected using laser excitations at 785 (black), 532 (purple), and 488 nm (red), respectively. b) UV-vis spectra: CdTe washings (red); HiPco SWNTs (blue); CdTe-SWNT heterostructure (black); and ozonized SWNTs-(green). c) Near-IR spectra for HiPco tubes (green) and for CdTe-SWNT heterostructures (blue).

The Raman spectra of the initial sidewall-ozonized nanotubes (Banerjee et al., J. Phys Chem. B, 106:12144 (2002)) are characterized by a sharp increase in the D band near 1330 cm$^{-1}$ with respect to the tangential mode near 1590 cm$^{-1}$ (FIG. 12a). The CdTe-nanotube heterostructure Raman spectrum varies depending on the excitation wavelength. At 488 and 532 nm laser excitation, the nanotubes are extensively resonance enhanced, and hence, only nanotube-related peaks are observed. At 785 nm, where resonance enhancement for the nanotubes is less pronounced, a peak for the CdTe phonon modes is detected, broadened, and downshifted from the longitudinal-optic (LO) phonon bulk frequency, expected at ~170 cm$^{-1}$ (Rolo et al., Phys. Status Solidi B 229:433 (2002)). This alteration likely occurs as a result of confinement effects, as noted previously in scattering studies of CdTe QDs (Rolo et al.)

Figure 12B:
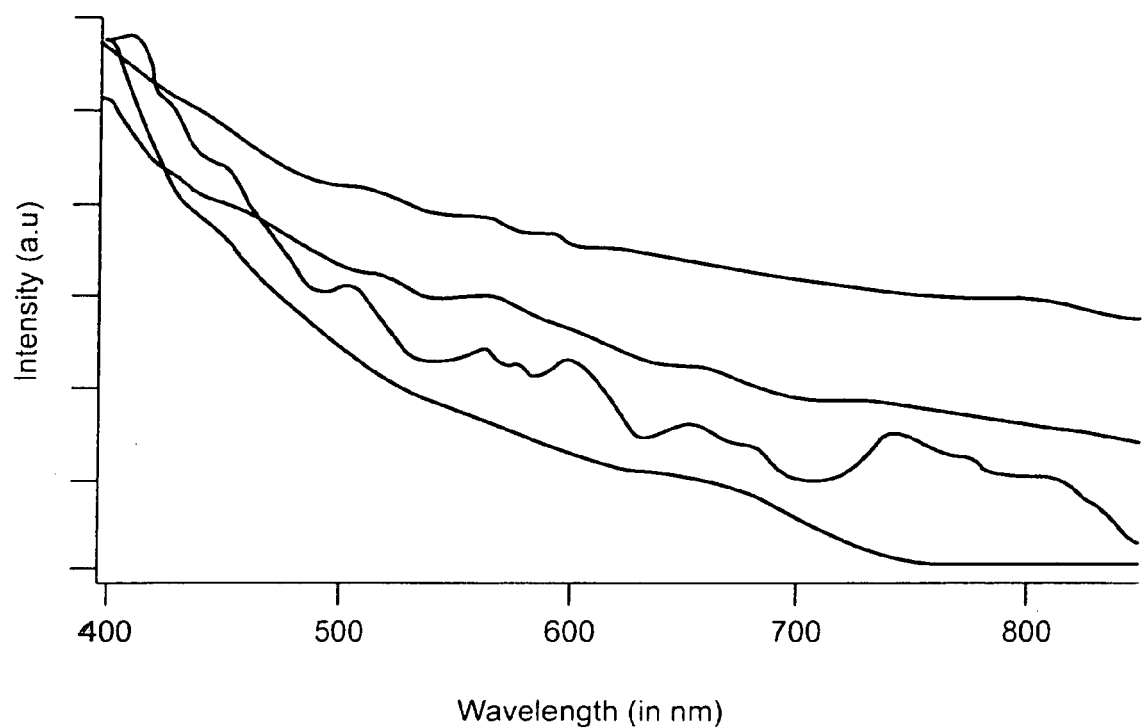
Figure 12C:
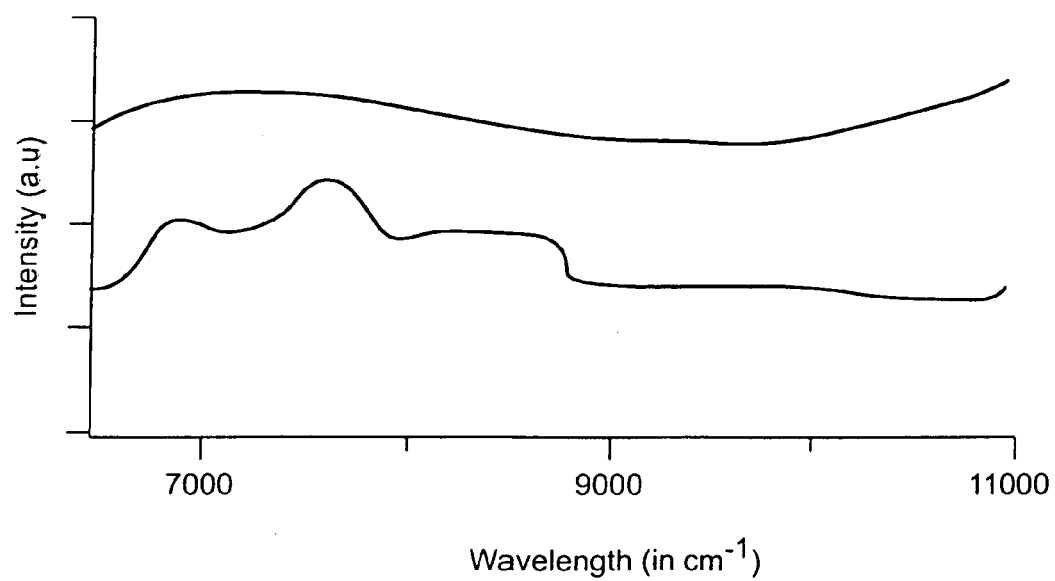
Figure 13A:
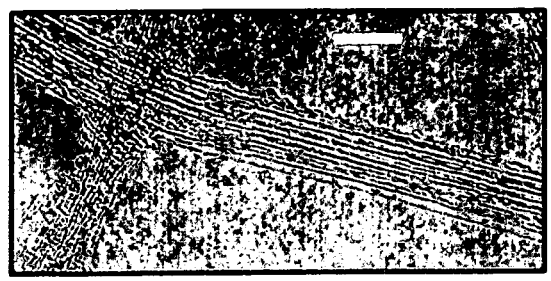
FIG. 13. High-resolution transmission electron micrographs of (a) air-oxidized, purified nanotubes and of (b) sidewall-ozonized SWNTs. Scale bars are 20 nm in each image. Note aggregate bundle and kink formation as well as loss of crystallinity in highly oxygenated ozonized tubes.
Figure 13B:
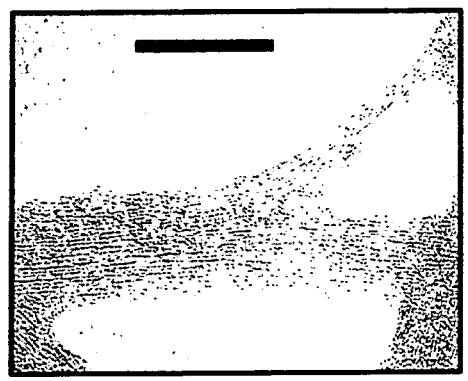

The visible and near-IR spectra (FIGS. 12b, c) of sidewall-ozonized tubes (Banerjee et al., J. Phys Chem. B 106:12144 (2002)) and of the nanotube-nanocrystal heterostructure formed using these functionalized tubes are characterized by the loss of van Hove singularities due to the perturbation of electronic structure (Bahr et al., J. Mater. Chem., 12:1952 (2002); A. Hirsch, Angew. Chem. Int. Ed., 41:1853 (2002); and Banerjee et al., J. Phys Chem. B, 106:12144 (2002)). No CdTe exciton peak is distinctly resolvable within that of the heterostructure, which could be due to a) the peaks being obscured by the broad nanotube background absorption, as well as b) the large polydispersity in size and shape of the crystallites on the SWNT surface. The PL spectrum of the heterostructure, upon excitation at 420 nm in dimethylformamide (DMF), shows low luminescence intensity. This observation could be due to a) nonradiative recombination of charge carriers at surface traps, caused by uneven surface passivation of CdTe by the bulky nanotube ligand, or b) quenching of the CdTe luminescence by the nanotube (Qu et al., J. Chem. Phys. 117:8089 (2002)).

Example 3

Synthesis of Single-Walled Nanotube Heterostructures Comprising CdSe Nanocrystals Nanotubes were ozonized and oxidized as described in Banerjee et al. J. Phys. Chem B 106:12144 (2002).

Covalent sidewall functionalization of SWNTs was achieved by an initial treatment with ozone, followed by primary ozonide cleavage with hydrogen peroxide. (See U.S. application Ser. No. 10/701,402, incorporated herein by reference.) Carboxylic acids are expected as the predominant functional group on the heavily oxidized nanotube sidewalls. These functional groups, collectively covering up to 30% of the external nanotube surface sites, now act as reactive sites to coordinate onto organometallic metal precursors to CdSe quantum dot formation. Briefly, CdO was dissolved in trioctylphosphine oxide (TOPO) at 320° C., in the presence of ozone/$H_2O_2$ treated HiPco (high-pressure CO decomposition) SWNTs. A substoichometric amount of tetradecylphosphonic acid (TDPA) was used to facilitate solubilization of CdO so that the Cd precursor could facilely complex with the oxygen-bearing SWNT sidewalls.

A mixture of selenium and tributyl phosphine in trioctyl phosphine and toluene was then rapidly injected at 270° C. and quantum dots were allowed to grow at 250° C. under vigorous stirring for about 5 min. In subsequent workup and purification, toluene was added at 50° C., followed by methanol, which then precipitated unattached CdSe nanocrystals. After filtration over a 0.2 μm PTFE membrane and extensive washing with toluene to remove all unattached nanocrystals, the remaining dark residue was dried and characterized.

In parallel experiments, the growth of quantum dots by similar procedures on less oxygenated tubes was performed. In these procedures, methods of oxygenation included (i) wet air oxidized SWNTs, (ii) $KMnO_4$/$H_2SO_4$-treated MWNTs, and (iii) ozone-oxidized MWNTs. A compelling observation that confirms the existence of a chemical interaction of nanotubes with quantum dots is that the degree of immobilization of CdSe on the nanotube surface correlates with the degree of oxidation. Because of the relatively unreactive large diameter of the outer walls of MWNTs, these tubes were not extensively functionalized (<2% oxygenated sites). Instead, end caps and defect sites, where metal precursor coordination to the nanotube could occur, were few and far between, after these comparatively mild oxidative treatments. Hence, CdSe nanocrystals were unable to be immobilized on MWNTs with this relatively low extent of oxidation. Similarly, with air-oxidized and $KMnO_4$/$H_2SO_4$-treated MWNTs, which were mildly oxidized (<5% oxygenated sites) and hence bore a low density of functional groups, the number of quantum dots observed on the nanotube surface was correspondingly very low, barely forming at all.

Characterization

Figure 14A:
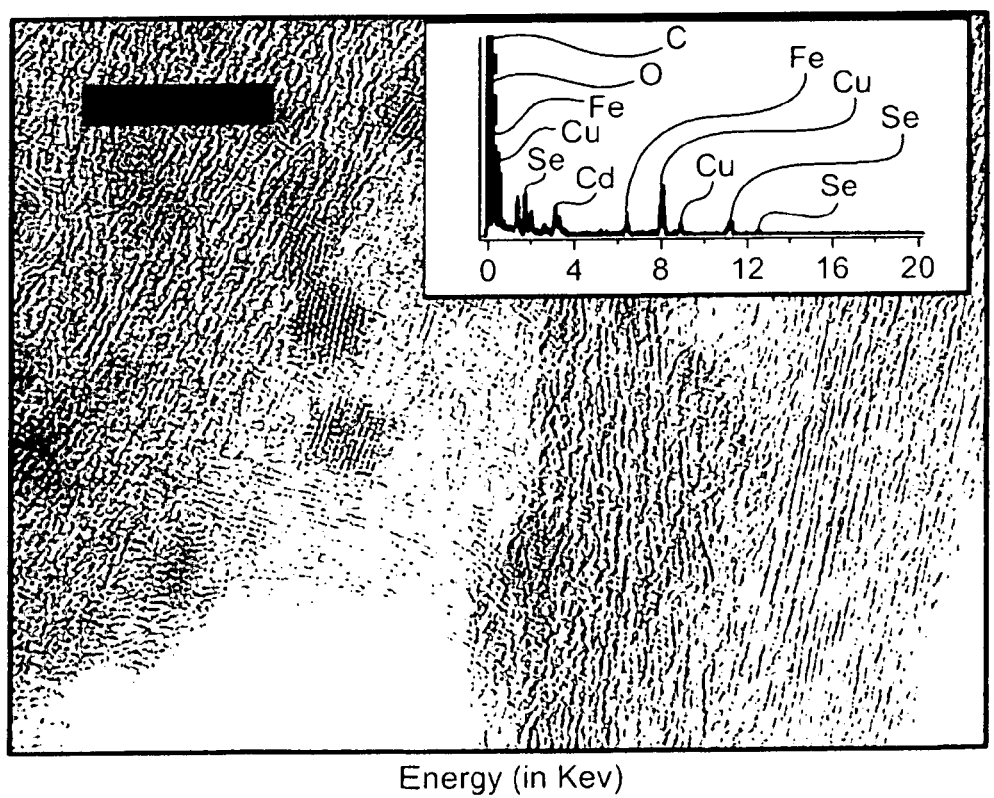
FIG. 14. High-resolution TEM images of CdSe-SWNT heterostructures. Substantial nanocrystal coverage at nanotube junctions and between bundles (a) as well as along sidewalls (b) are shown. Overall coverage of nanocrystals was limited to ~10–15% of total surface area of ozonized tubes. EDS spectra (inset to a) indicate expected elemental signals. Cu and Fe signals arise from TEM grid and catalyst impurities from the HiPco process, respectively. Scale bars are 10 nm in each case.
Figure 14B:

As seen in FIG. 14, a reproducibly substantial quantity of quantum dots was observed dispersed along the heavily oxygenated, ozonized nanotube sidewalls. The high-resolution lattice-resolved images confirm the presence of wurtzite and zinc-blende CdSe structures. Further corroboration comes from the energy dispersive X-ray spectroscopy (EDS) data in FIG. 14, indicating the presence of Cd and Se localized on the nanotubes in the form of quantum dots. Because outer tubes in a bundle are more extensively functionalized as compared with tubes in the inner core of the bundle, as well as more accessible to the monomer flux necessary for the growth of CdSe, a larger concentration of quantum dots on the exterior of the tubes was found. XPS measurements were also consistent with the expected formation of CdSe. Data showed peaks corresponding to Cd $3d_{5/2}$ fitted to 405.45 eV and to Se $3d_{5/2}$ fitted to 54.63 eV.

Figure 15:
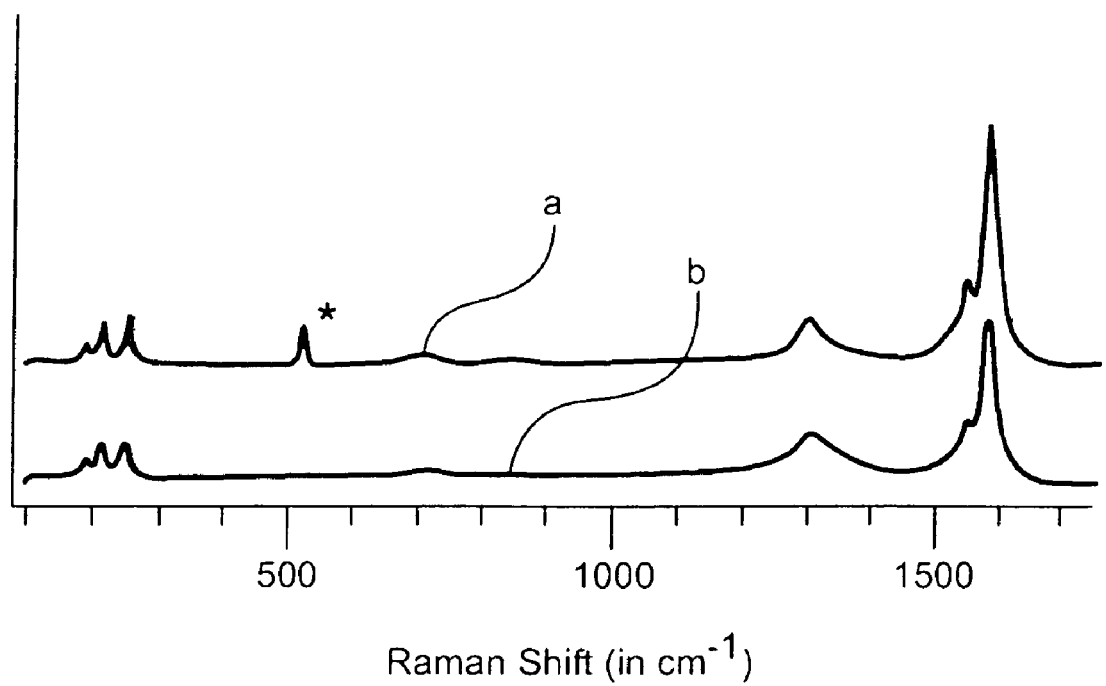
FIG. 15. Raman spectra of (a) ozonized SWNTs and (b) CdSe-ozonized SWNTs heterostructures at 632.8 nm excitation. Starred peak arises from the silicon substrate.

Raman spectroscopy is a sensitive probe of electronic structure and electron-phonon coupling in SWNTs (Dresselhaus et al. *Acc. Chem. Res.* 35:1070 (2002)). As mentioned, ozonolysis of SWNTs is accompanied by an increase in the intensity of the Raman D band, due to disruption of the pseudo-ID lattice (Banjeree et al. *J. Phys. Chem. B* 106: 12144 (2002); Banerjee et al. *Chem. Comm.* 772 (2002)). After quantum dot growth, in the Raman spectra acquired at 632.8 nm laser excitation (FIG. 15), features associated with carbon nanotubes are largely preserved because of resonance enhancement (M. S. Strano *J. Am. Chem. Soc.* 125: 16148 (2003)). At this wavelength, signals, i.e. LO modes, due to CdSe quantum dots grown on the tubes are not observed mainly because of the polydisperse nature of the generated nanocrystals, likely because the incident excitation is off resonance (Alivisatos et al. *J. Chem. Phys.* 89:5979 (1988)).

The varying sizes and shapes of CdSe nanocrystals observed demonstrate that the functionalized nanotubes influence the size, shape, and growth of the nanocrystals. Without wanting to be bound by a mechanism, it is believed that nanotubes act as sterically bulky ligands in the growth of the quantum dots and hence, are able to spatially hinder monomer access to one side of the growing crystallite, thereby causing dispersion in the aspect ratio.

Another factor influencing quantum dot formation is the competitive, preferential attachment of the growing crystal facet to the nanotube ligand, as opposed to the molecular, acid-capping ligand. The degree of the influence of SWNTs in determining the resultant dimension range of formed quantum dots depends on parameters such as the site of attachment, the density of functional groups, as well as the extent of nanotube aggregation, i.e. size of the ligand.

Chemical attachment of quantum dots onto nanotube surfaces can be confirmed by (a) dispersion in quantum dot sizes and shapes; and (b) control experiments with mildly oxidized tubes.

We claim:

1. A fused heterostructure comprising a carbon nanotube and at least one nanocrystal, wherein the nanocrystal is directly attached by a covalent linkage to at least one oxygen moiety on the nanotube, and wherein there is no intermediary linker between the nanotube and the nanocrystal.

2. The heterostructure according to claim 1 wherein the covalent linkage is a coordinative linkage.

3. The heterostructure according to claim 1 wherein said at least one oxygen moiety is selected from the group consisting of a carboxyl group, a hydroxyl group, an aldehydic group, a ketonic group, an esteric group and an etheric group.

4. The heterostructure according to claim 1 wherein the nanocrystal is a transition metal chalcogenide.

5. The heterostructure according to claim 4 wherein the transition metal chalcogenide nanocrystal is a wurtzite cadmium selenide, a zinc blende cadmium selenide, cadmium sulfide, cadmium telluride, zinc selenide, or zinc sulfide.

6. The heterostructure according to claim 4 wherein the transition metal chalcogenide nanocrystal is a mercury sulfide, mercury selenide, mercury telluride or zinc telluride.

7. The heterostructure according to claim 1 wherein the nanocrystal is gallium arsenide, indium gallium arsenide, indium phosphide, indium arsenide.

8. The heterostructure according to claim 1 wherein the nanocrystal is a metal oxide.

9. The heterostructure according to claim 8 wherein the metal oxide is a titanium dioxide, zirconium oxide, aluminum oxide, iron oxide, ruthenium oxide, or silicon oxide.

10. The heterostructure according to claim 1 wherein the nanocrystal is a colloidal elemental metal.

11. The heterostructure according to claim 10 wherein the colloidal elemental metal is gold, silver, platinum, copper, germanium or silicon.

12. The heterostructure according to claim 1 wherein the nanocrystal is a nanobimetallic dispersion.

13. The hetero structure according to claim 12 wherein the nanobimetallic dispersion is silver/iridium, platinum/gold, silver/palladium, platinum/palladium, nickel/palladium or platinum/ruthenium.

14. The heterostructure according to claim 1 wherein the carbon nanotube is single-walled.

15. The heterostructure according to claim 14 wherein the diameter of the single-walled carbon nanotube is about 0.7 to about 2.5 nm.

16. The heterostructure according to claim 1 wherein the carbon nanotube is multi-walled.

17. The heterostructure according to claim 16 wherein the diameter of the multi-walled carbon nanotube is about 3 to about 30 nm.

18. The heterostructure according to claim 1 wherein the carbon nanotube is a semi-conductor.

19. The heterostructure according to claim 1 wherein the carbon nanotube is metallic.

20. A device comprising the heterostructure of claim 1 wherein the device is selected from the group consisting of sensors, a device used in molecular electronics, solar cells, a device used in optoelectronics, a device used in nanocatalysis, and scanning probe microscopy tips.

21. A nanoscale assembly comprising at least two heterostructures
wherein a heterostructure comprises a carbon nanotube and at least one nanocrystal, wherein the nanocrystal is attached by a covalent linkage to at least one oxygen moiety on the nanotube, wherein there is no intermediary linker between the nanotube and the nanocrystal, and wherein the hetero structures of the assembly are joined by nanocrystals.

22. The nanoscale assembly of claim 21 comprising at least about two to hundreds of thousands of nanotubes.

* * * * *

UNITED STATES PATENT AND TRADEMARK OFFICE
CERTIFICATE OF CORRECTION

PATENT NO. : 7,189,455 B2  Page 1 of 1
APPLICATION NO. : 10/910784
DATED : March 13, 2007
INVENTOR(S) : Wong et al.

It is certified that error appears in the above-identified patent and that said Letters Patent is hereby corrected as shown below:

Column 5, Line 56          Now reads:     "nariotube"

Should read:   -- nanotube --

Column 11, Line 20         Now reads:     "35020 C."

Should read:   --350°C.--

Signed and Sealed this

Eighteenth Day of September, 2007

JON W. DUDAS
*Director of the United States Patent and Trademark Office*